(12) United States Patent
Lisec et al.

(10) Patent No.: US 10,854,223 B2
(45) Date of Patent: Dec. 1, 2020

(54) METHOD OF PRODUCING A MAGNETIC STRUCTURE

(71) Applicant: Fraunhofer-Gesellschaft zur Foerderung der angewandten Forschung e.V., Munich (DE)

(72) Inventors: Thomas Lisec, Itzehoe (DE); Fabian Lofink, Itzehoe (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 263 days.

(21) Appl. No.: 15/679,905

(22) Filed: Aug. 17, 2017

(65) Prior Publication Data
US 2018/0053523 A1 Feb. 22, 2018

(30) Foreign Application Priority Data

Aug. 19, 2016 (DE) .................. 10 2016 215 616

(51) Int. Cl.
*G11B 5/39* (2006.01)
*G01R 33/06* (2006.01)
(Continued)

(52) U.S. Cl.
CPC ............ *G11B 5/3932* (2013.01); *G01R 33/06* (2013.01); *G11B 5/3903* (2013.01);
(Continued)

(58) Field of Classification Search
None
See application file for complete search history.

(56) References Cited

U.S. PATENT DOCUMENTS

| 6,553,651 B2 * | 4/2003 | Reznik | H01F 41/16 29/608 |
| 6,572,371 B1 | 6/2003 | Sion et al. | |

(Continued)

FOREIGN PATENT DOCUMENTS

| CA | 2268729 A1 | 4/1998 |
| CN | 1171137 A | 1/1998 |

(Continued)

OTHER PUBLICATIONS

Machine translation of DE102011010899 (Year: 2019).*
(Continued)

*Primary Examiner* — Mandy C Louie
(74) *Attorney, Agent, or Firm* — Perkins Coie LLP; Michael A. Glenn

(57) ABSTRACT

A device and to a method of producing a device, wherein the method includes, inter alia, providing a substrate and generating at least two mutually spaced-apart cavities within the substrate. In accordance with the invention, each cavity has a depth of at least 50 μm. The cavities are filled up with magnetic particles, wherein the magnetic particles enter into contact with one another at points of contact, and wherein cavities are formed between the points of contact. At least some of the magnetic particles are connected to one another at their points of contact, specifically by coating the magnetic particles, wherein the cavities are at least partly penetrated by the layer produced in the coating process, so that the connected magnetic particles form a magnetic porous structure.

7 Claims, 11 Drawing Sheets

(51) Int. Cl.
*H01F 10/32* (2006.01)
*H01F 41/30* (2006.01)
*H01F 41/34* (2006.01)
*H01F 10/12* (2006.01)
*H01F 41/22* (2006.01)

(52) U.S. Cl.
CPC ......... *H01F 10/324* (2013.01); *H01F 41/302* (2013.01); *H01F 41/34* (2013.01); *G11B 5/3906* (2013.01); *H01F 10/126* (2013.01); *H01F 41/22* (2013.01)

(56) References Cited

U.S. PATENT DOCUMENTS

| | | | |
|---|---|---|---|
| 6,573,623 B2 * | 6/2003 | Tsuboi | H02K 29/08 |
| | | | 310/12.19 |
| 9,221,217 B2 | 12/2015 | Lisec et al. | |
| 2001/0019752 A1 | 9/2001 | Purdy et al. | |
| 2002/0197622 A1 * | 12/2002 | McDevitt | G01N 33/54366 |
| | | | 435/6.12 |
| 2004/0070816 A1 * | 4/2004 | Kato | G02B 26/085 |
| | | | 359/291 |
| 2004/0112937 A1 * | 6/2004 | Laermer | B81B 7/0064 |
| | | | 228/101 |
| 2004/0155010 A1 | 8/2004 | Benzel et al. | |
| 2004/0241034 A1 * | 12/2004 | Mino | H01F 41/0266 |
| | | | 419/66 |
| 2007/0134939 A1 | 6/2007 | Brueck et al. | |
| 2007/0228862 A1 * | 10/2007 | Welchko | H02K 1/2766 |
| | | | 310/156.53 |
| 2008/0024118 A1 | 1/2008 | Kahlman et al. | |
| 2008/0160787 A1 | 7/2008 | Lehmann | |
| 2009/0258168 A1 | 10/2009 | Barcock et al. | |
| 2009/0286402 A1 | 11/2009 | Xia et al. | |
| 2010/0123456 A1 | 5/2010 | Boeve et al. | |
| 2011/0018136 A1 | 1/2011 | Bedair et al. | |
| 2013/0058785 A1 | 3/2013 | Kellerer et al. | |
| 2013/0102121 A1 | 4/2013 | Kim et al. | |
| 2014/0023849 A1 | 1/2014 | Lisec et al. | |
| 2015/0111062 A1 | 4/2015 | Shen | |
| 2015/0361489 A1 | 12/2015 | Soper et al. | |
| 2017/0278605 A1 | 9/2017 | Lisec et al. | |
| 2018/0029002 A1 | 2/2018 | Lisec et al. | |

FOREIGN PATENT DOCUMENTS

| | | |
|---|---|---|
| CN | 1234014 A | 11/1999 |
| CN | 1650042 A | 8/2005 |
| CN | 1957257 A | 5/2007 |
| CN | 102027572 A | 4/2011 |
| CN | 104042214 A | 9/2014 |
| DE | 10118568 A1 | 10/2002 |
| DE | 102005010080 A1 | 9/2006 |
| DE | 102007029445 A1 | 12/2008 |
| DE | 102011000486 A1 | 8/2012 |
| DE | 102011010899 A1 | 8/2012 |
| DE | 102014226138 A1 | 6/2016 |
| DE | 102015206377 A1 | 10/2016 |
| EP | 2584588 A1 | 4/2013 |
| JP | 2005213556 A | 8/2005 |
| JP | 2011173749 A | 9/2011 |
| WO | 2016096636 A1 | 6/2016 |

OTHER PUBLICATIONS perpetuum.com, [online], Retrieved from: <http://www.perpetuum.com/products/vibration-energy-harvester.asp>.
"Fensterbaufirmen—Längenmessung", Intertronic Gresser GmbH; [online] retrieved from http://www.interpatent.de/fensterbaufirmen_laengenmessung.html Mar. 15, 2018, 2010, 1-4.
"http://sensitec.com/deutsch/produkte/winkel/winkelmessung-erlaeuterung.html", Springer-VDI-Verlag; [online] retrieved from https://www.konstruktion-online.de/Heftarchiv/2017/Ausgabe-S2/Messen-Pruefen-Ueberwachen/Neuentwicklungen-bei-magnetoresistiven-Sensoren-fuer-intelligente-Lager on Mar. 1, 2017, The picture referred to has been found on a different website. 3 screenshots as one file are attached., 2017, 1-3.
"http://www.bogen-electronic.com/Lineare_Massstaebe.html", BOGEN Electronic GmbH; [online] retrieved from http://www.bogen-electronic.com/files/bilder/PDF/Technical_Data_Sheet_LMS.pdf Mar. 15, 2018, 1-7.
Achayya, A. et al., "Experimental Study on the Effect of Magnetic Field on Current-Voltage Characteristics of N-Channel Enhancement—Type MOSFET", Journal of Electron Devices, vol. 13, 2012, 945-948.
Ando, B. et al., "Nonlinear Mechanism in MEMS Devices for Energy Harvesting Applications", J. Micromech Microeng 20 125020, 2010, 1-12.
Clark, J. J. , "CMOS Magnetic Sensor Arrays", Proc. IEEE Solid-State Sensor and Actuator Workshop, 1988.
Galchev, T. et al., "Non-Resonant Bi-Stable Frequency-Increased Power Scavenger From Low-Frequency Ambient Vibration", Proc. IEEE Transducers, Jun. 21-25, 2009.
Li, X. et al., "Li Non-Resonant Electromagnetic Energy Harvester for Car-Key Applications", PowerMEMS Journal of Physics: Conference Series 476 012069, 2013.
Najafi, K. et al., "Microsystems for Energy Harvesting", Proc. IEEE Transducers, Jun. 5-9, 2011.
Oniku, Ololade D. et al., "Permanent magnet microstructures using dry-pressed magnetic powders", IOP Publishing; Journal of Micromechanics and Microengineering 23 (2013), doi: 10.1088/0960-1317 /23/7/075027, Jun. 12, 2013, 1-11.
Reimer, Tim et al., "Temperature-stable NdFeB micromagnets with high-energy density compatible with CMOS back end of line technology", MRS Advances, 1:3 (Jan. 2016) pp. 209-213, DOI: 10.1557/adv.2015.19,, Dec. 25, 2015, 2019-213.
Xu, Zhi-Hao et al., "Grooved multi-pole magnetic gratings for high-resolution positioning systems", Japanese Journal of Applied Physics 54, 2015, http://dx.doi.org/10.7567/JJAP.54.06FP01, Apr. 15, 2015, 06FP01-1 to 06FP01-5.
Yang, Tzu-Shun et al., "Fabrication and characterization of parylene-bonded Nd—Fe-8 powder micromagnets", American Institute of Physics, Journal of Applied Physics 109, 07 A753 (2011), doi: 10.1063/1.3566001, Apr. 12, 2011, 07A753-1 to 07A753-3.
Zhi, Chao et al., "A polydimethylsiloxane diaphragm integrated with a sputtered thin film NdFeB magnet", Microsystem Technologies (2015) 21:675-681, DOI 10.1007/s00542-014-2085-z, Jan. 28, 2014, 675-681.

* cited by examiner

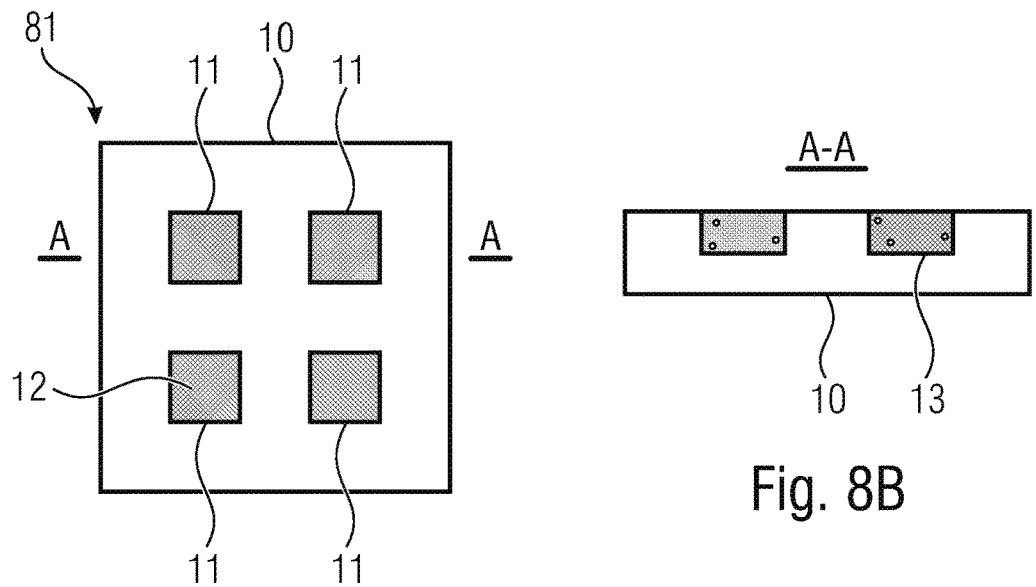
Fig. 8A
Fig. 8B
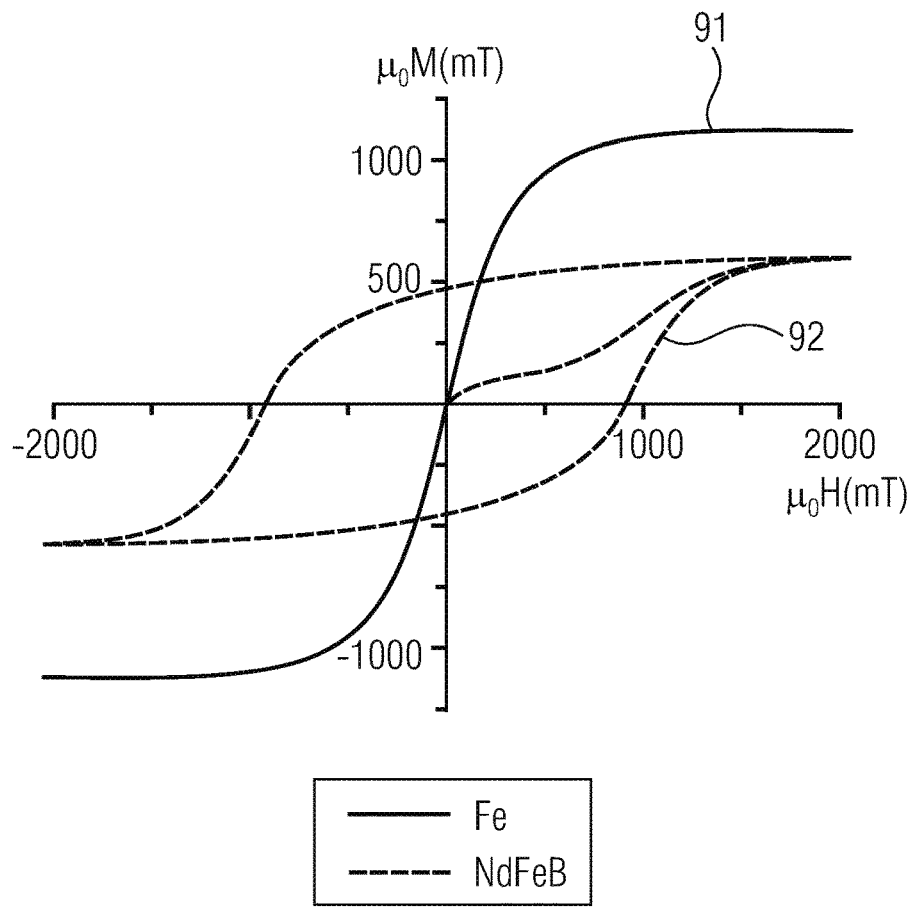
Fig. 9

METHOD OF PRODUCING A MAGNETIC STRUCTURE

CROSS-REFERENCE TO RELATED APPLICATIONS

This application claims priority from German Patent Application No. 10 2016 215 616.0, which was filed on Aug. 19, 2016, and is incorporated herein in its entirety by reference.

The invention relates to a device having a magnetic structure, and to a microfabricated magnetic measuring bar comprising such a device having a magnetic structure and a magnetic sensor.

BACKGROUND OF THE INVENTION

For many technical devices, three-dimensional arrangements of permanent magnets for generating specific field patterns are indispensable for many technical devices. Often, the degree of miniaturization that is desired is difficult to achieve by means of conventional techniques since there are limits to mechanical processing of permanent magnets, inter alia due to the brittleness of the materials (e.g. NdFeB). The present application describes alternative possibilities of producing miniaturized magnetic arrangements.

An important field of application is magnetic detection of positions in installations and devices of all kinds for determining angles, routes and absolute positions. Such a system consists of a magnetic measuring bar and a reading head led across it. The reading head is mostly based on an MR sensor able to detect electromagnetic fields with a very high level of resolution.

Depending on the application, these magnetic measuring bars have very different geometries. In the event of routing, the classic measuring bar often consists of a magnetic tape mounted on a carrier made of stainless steel (see [1] and [2]). Such a magnetic tape is coded (magnetized) in a customized manner on specific installations. The positioning accuracy is determined by the pitch of the magnetized areas.

A pitch of 0.5 mm is state of the art. While using modern MR sensors and optimized measuring algorithms, a resolution of approx. $^{1}\!/_{1000}$ of the pitch, i.e. a positioning accuracy of 0.5 mm, can be achieved.

Magnetic measuring bars, e.g. in the form of magnetic pulse wheels, are used also for determining angles (see [3]). Just like in the case of the magnetic tape, they are coded on specific installations.

Further improvement of the resolution of the magnetic position detection is of considerable interest. Said magnetic position detection is obviously limited mainly by the magnetic measuring bar. In this context, alternative technologies have been sought for.

To solve said problem, a proposition is made in [4], for example, to replace the above-mentioned magnetic tape by a sequence of mutually separate hard magnetic structures. Such a measuring bar is produced, in [4], from CoNiP strips having a width of 200 μm by means of techniques of semiconductor technology using electrodeposition with a resist mask on a silicon substrate.

In this manner, measuring bars having pitches within the μm range may be readily produced. A considerable advantage as compared to the above-mentioned classic magnetic tape is that sequential coding, which is time-consuming, is dispensed with. The mutually separated hard magnetic structures may be magnetized all at once.

However, only few hard magnetic materials, which additionally are comparatively weak, can be electrodeposited, such as CoPt, FePt or CoNiMnP, for example. Also, layer thicknesses of more than 50 μm are very difficult to implement since any follow-up processes performed at elevated temperatures may easily result in stress-induced delamination of the galvanic structures.

An alternative to electroplating is sputtering. By means of sputtering, e.g. NdFeB may be deposited, the hard magnetic properties of which are superior by several factors to those of galvanic materials. However, sputtered layers are mostly limited to thicknesses of few micrometers. The sputtered NdFeb magnet having a thickness of approx. 15 μm which is described in [5] is an extreme example of this. Disadvantageous as compared to structures produced by electrodeposition are the high deposition temperatures as well as the fact that the sputtered layer subsequently needs to be structured (patterned).

It is therefore desirable to improve known miniaturized magnetic structures to the effect that they generate high magnetic field strengths despite having a pitch within the micrometer range.

SUMMARY

According to an embodiment, a method may have the steps of: providing a substrate and producing at least two mutually spaced-apart cavities within the substrate, each cavity having a depth of at least 50 μm, filling up the cavities with magnetic particles, wherein the magnetic particles enter into contact with one another at points of contact, and wherein cavities are formed between said points of contact, and connecting at least some of the magnetic particles at their points of contact by coating the magnetic particles, wherein the cavities are at least partly penetrated by the layer produced during coating, so that the connected magnetic particles form a magnetic porous structure.

According to another embodiment, a device may have: a substrate including at least two mutually spaced-apart cavities, each cavity having a depth of at least 50 μm, wherein the cavities are filled up with magnetic particles which enter into contact with one another at points of contact and form cavities between the points of contact, and wherein at least some of the magnetic particles are connected to one another at their points of contact by means of a coating, specifically in such a manner that the cavities are at least partly penetrated by the coating and such that the connected magnetic particles consequently form a magnetic porous structure.

According to yet another embodiment, a system may have: a device including a substrate having at least two mutually spaced-apart cavities, each cavity having a depth of at least 50 μm, wherein the cavities are filled up with magnetic particles which enter into contact with one another at points of contact and form cavities between the points of contact, and wherein at least some of the magnetic particles are connected to one another at their points of contact by means of a coating, specifically in such a manner that the cavities are at least partly penetrated by the coating and such that the connected magnetic particles consequently form a magnetic porous structure; and a magnetic sensor configured to determine the magnetic field strength emanating from the device in that it is moved past the porous magnetic structures at a distance from the substrate and along an outer side of the substrate, specifically on that outer side of the substrate which is located opposite the opening of the respective cavity.

In the inventive method, a substrate is provided. At least two mutually spaced-apart cavities are produced within said substrate. Each cavity has a depth of at least 50 µm. Said cavities are filled up, advantageously completely, with magnetic particles. At points of contact, said magnetic particles come into contact with one another, cavities forming between the points of contact. The magnetic particles are coated by using a coating process, e.g. an ALD (Atomic Layer Deposition) coating process. In this manner, at least some of the magnetic particles connect to one another, specifically at their respective points of contact, in that the cavities are at least partly penetrated by the layer produced during coating. As a result, the magnetic particles solidify to form a magnetic porous structure. Thus, each cavity has a magnetic porous structure formed therein. The size of the respective magnetic porous structure depends on the volume of the cavity and its degree of filling (i.e. the amount of particles filled into the cavity). This means, if a cavity having a depth of 50 µm is fully filled up with magnetic particles, and if said particles are solidified to form the magnetic porous structure by means of the coating process, said magnetic porous structure will thus also have a thickness (in the direction of depth of the cavity) of 50 µm. With the inventive method, for example such hard magnetic particles, e.g. NdFeB particles, may be filled into the cavity which are able to generate a substantially stronger magnetic field than that generated by other materials which may be deposited onto the substrate by means of deposition methods. Wth electrodeposited or sputtered magnetic structures, the aspect ratios mostly remain clearly below 1. I.e., electrodeposited or sputtered magnetic structures typically have a layer thickness of clearly below 50 µm. However, with the inventive method it becomes possible to provide magnetic structures having thicknesses (in the direction of depth of the cavity) of 50 µm or more.

It is feasible for the cavities to be introduced into the substrate such that each cavity has an aspect ratio of at least 4:1 or 6:1 or 10:1. With the inventive method, aspect ratios of up to 10:1 and more may thus be implemented, which accordingly leads to an increase in the magnetic flux density of the magnetic porous structures generated within the cavities. The aspect ratio is the ratio between the depth of the cavity (i.e. of the depth of penetration of the cavity into the substrate) and its (smallest) lateral extension. Accordingly, each cavity which in accordance with the invention has a (penetration) depth of 50 µm has a lateral extension amounting to a quarter or one sixth or one tenth of the amount of the depth. The inventive aspect ratio ensures that the magnetic porous structures generated within the cavities have a magnetic flux density that is clearly higher than that of deposited materials. However, it is the very high inventive aspect ratio of 4:1 or 6:1 or 10:1 by means of which a high magnetic flux density is implemented.

In addition, it is conceivable for the cavities to be introduced into the substrate such that each cavity has a lateral extension of 250 µm or less or of 100 µm or less or of 50 µm or less or of 25 µm or less. I.e., if the cavity has a lateral extension of 10 µm at an aspect ratio of 6:1, the cavity will have a depth of 60 µm. The indicated lateral extensions in combination with the inventive aspect ratios thus result in particularly advantageous implementations of magnetic porous structures having magnetic flux densities which are clearly higher as compared to the conventional technology.

In accordance with one embodiment of the inventive method, the substrate may have an additional coating applied to it which extends across the cavities filled with the magnetic particles so as to seal the cavities. Said additional coating may be applied onto the outer side of the substrate, specifically onto that outer side of the substrate where there are the openings of the cavities. Said additional coating may be applied onto the magnetic porous structures and onto the substrate, e.g., by means of sputtering, electrodeposition or by means of PECVD (Plasma-Enhanced Chemical Vapor Deposition). Said additional coating may provide reliable protection from corrosion, for example if the magnetic porous structures are sealed on all sides, and advantageously hermetically, by means of the additional coating. Moreover, with the additional coating one may achieve considerable improvement of the magnetic properties of the magnetic porous structures when the magnetic flux of the magnetic porous structures may be closed by applying a, e.g., soft magnetic layer, e.g. Fe or NiFe. The coating may comprise one or more layers, e.g. a dielectric layer and a soft magnetic layer.

It is conceivable for the cavities to be introduced into the substrate such that a residual thickness, which remains within the direction of depth, between the deepest point of the cavity and that outer side of the substrate which is closest in the direction of depth amounts to from 10 µm to 100 µm. In other words, the cavities are introduced from a first outer side of the substrate toward an opposite second outer side of the substrate. The cavities here therefore extend from the first outer side to the second outer side, the direction of extension also being referred to as the direction of depth. The cavities extend, in the direction of depth, up to precisely such a point that a substrate material having a thickness of from 10 µm to 100 µm remains between the deepest point of the cavity and the second outer side of the substrate. Therefore, the distance between the deepest point of the cavity and the substrate is set.

The cavities may be introduced into the substrate by using a dry-etching method. Moreover, an etch stop layer may be provided within the substrate which extends essentially orthogonally to the direction of depth of the cavities. The etching process ends at the etch stop layer, i.e. the cavity is formed only up until the etch stop layer rather than beyond. By means of the etch stop layer, one may achieve a residual thickness, which is considerably smaller and better defined, between the deepest point of the cavity and that outer side of the substrate which is closest in the direction of depth. For example, Si wafers having buried etch stop layers of $SiO_2$ are commercially available as so-called SOI (Silicon-On-Insulator) substrates. The thickness of the SOI layer, which may consist of monocrystalline silicon, for example, may be set to have almost any value.

In accordance with embodiments, the etch stop layer may comprise silicon oxide or silicon nitride, for example. Alternatively or additionally, the etch stop layer may comprise a metal, a metal oxide or a metal nitride. This means that the inventive manufacturing process is not restricted to SOI substrates. Many other combinations of materials are feasible for setting the residual thickness between the deepest point of the cavity and that outer side of the substrate which is closest in the direction of depth. A thick polysilicon layer may be used, for example, instead of the monocrystalline SOI layer. At high temperatures, polysilicon may readily be deposited with thicknesses of up to 50 µm. Likewise, one might use an electrodeposited copper layer. In addition to silicon oxide, silicon nitride, various metals and their oxides and nitrides may also be considered for being used as a buried etch stop layer.

In accordance with embodiments of the invention, the etch stop layer may be arranged between the substrate and an SOI layer, the SOI layer having a layer thickness of between 1 µm and 100 µm, or a layer thickness of between 10 µm and 100 µm, or a layer thickness of between 50 µm and 100 µm. The distance between the deepest point of the cavity and that outer side of the substrate which is closest in the direction of depth might therefore be reduced to few micrometers. Layer thicknesses of between 1 µm and 100 µm are useful for achieving sufficient mechanical stability.

Further, it is feasible for the cavities to have, at their lower portion when viewed in the direction of depth, a tapered portion in each case which is introduced into the substrate by using a wet-chemical etching process. Tapering of the lower portion of the cavities results in a further increase in the field line density of the magnetic porous structures. Introducing said tapering is possible, e.g., by means of anisotropic etching of a trench having inclined side walls in an aqueous KOH or TMAH solution prior to dry etching.

In this context it would also be feasible for the tapered portion to be filled with a material which has a higher saturation magnetization as compared to the magnetic particles. The material used for filling may be a ferromagnetic material, for example. Thereby, a further increase in the field line density of the magnetic porous structures may be achieved. Thus, one might achieve an increase in the field line density to at least double its value by, e.g., filling up the tapering cavity end portions with iron instead of NdFeB. Filling of the cavities may be performed in two steps, for example, wherein the cavity is at first partly filled with iron powder and subsequently is completely filled up with NdFeB powder.

In accordance with a further feasible embodiment, wherein the substrate comprises a base substrate and a covering substrate having at least two openings which fully extend through said covering substrate, wherein the covering substrate is joined to the base substrate, and wherein the openings within the covering substrate have a distance which is identical to the distances of the cavities within the base substrate, so that when the covering substrate is joined to the base substrate, the at least two openings within the covering substrate become congruent with the at least two cavities within the base substrate. Thus, a two-part substrate is provided, both parts of which are joined to form the final substrate.

In this context it would be feasible for the base substrate to comprise silicon and for the covering substrate to comprise plastic. Plastic may be processed in a simple manner and is considerably cheaper than silicon.

In accordance with an embodiment of the inventive method, the substrate may be removed in portions or completely so as to expose at least portions of the magnetic porous structures. Thus, e.g., a flexible magnetic device having free-standing magnetic porous structures may be produced.

In addition, the problem mentioned at the outset is solved by means of an inventive device comprising, inter alia, a substrate having at least two mutually spaced-apart cavities. Each cavity has a depth of at least 50 µm. Said cavities are filled up with magnetic particles which come into contact with one another at points of contact and form cavities between the points of contact. In terms of the subject matter, the inventive device is easy to distinguish from a conventional device since some of the magnetic particles are connected to one another at their points of contact by means of a coating, specifically such that the cavities are at least partly penetrated by the coating and that the connected magnetic particles form a magnetic porous structure as a result. This is clearly different from conventional devices having magnetic layers deposited thereon.

In accordance with an embodiment, each cavity may have an aspect ratio of at least 4:1 or 6:1 or 10:1.

Also, it is feasible for each cavity to have a lateral extension of 250 µm or less, or of 100 µm or less, or of 50 µm or less, or of 25 µm or less.

Moreover, it is conceivable for a coating to have been applied onto the substrate which extends across the cavities filled with the magnetic particles so as to seal the cavities.

The cavities may be formed within the substrate such that a residual thickness which remains, in the direction of depth, between the deepest point of the cavity and the outer side of the substrate amounts to from 10 µm to 100 µm.

In addition, the cavities may each comprise, at their lower portion when viewed in the direction of depth, a tapered portion which is filled with a material having a higher saturation magnetization as compared to the magnetic particles.

An embodiment of the inventive device provides for the substrate to comprise a base substrate and a covering substrate comprising at least two openings fully extending through said covering substrate, wherein the openings in the covering substrate have the same mutual distance as the distances of the cavities within the base substrate, and wherein the covering substrate is joined with the base substrate such that the at least two openings in the covering substrate are congruent with the at least two cavities within the base substrate.

Moreover, to solve the above-mentioned problem, the invention proposes a system comprising, inter alia, an above-mentioned device as well as a magnetic sensor. The magnetic sensor may be configured to determine the magnetic field strength emanating from the device in that it is moved past the porous magnetic structures at a distance from the substrate and along an outer side of the substrate, specifically on that outer side of the substrate which is located opposite the opening of the respective cavity.

BRIEF DESCRIPTION OF THE DRAWINGS

Embodiments of the present invention will be detailed subsequently referring to the appended drawings, in which:

FIG. 8A shows a top view of a test structure, FIG. 8B shows a sectional view along the intersection line A-A depicted in FIG. 8A, FIG. 9 shows a diagram for illustrating the magnetic field strengths of iron and NdFeB.

DETAILED DESCRIPTION OF THE INVENTION

FIGS. 1A to 1D show graphic pictures for illustrating an inventive method.

Figure 1A:
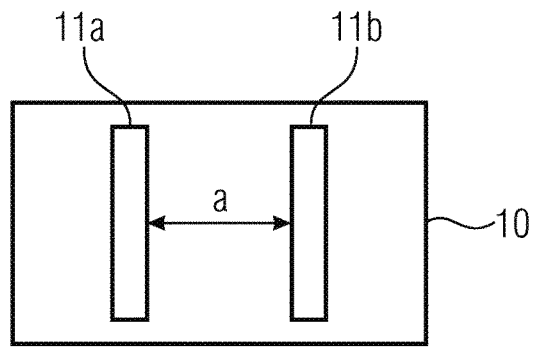
FIGS. 1A to 1D show graphic pictures for describing the inventive method as well as a top view (FIG. 1A) and lateral views of an inventive device.

FIG. 1A shows a top view of a substrate 10 comprising two mutually spaced-apart cavities 11a, 11b. The cavities 11a, 11b are introduced into the substrate 10 by means of suitable methods. The left-hand cavity 11a is spaced apart by a measure a from the right-hand cavity 11b. Said measure a will also be referred to as pitch when illustrating the following embodiments.

Figure 1B:
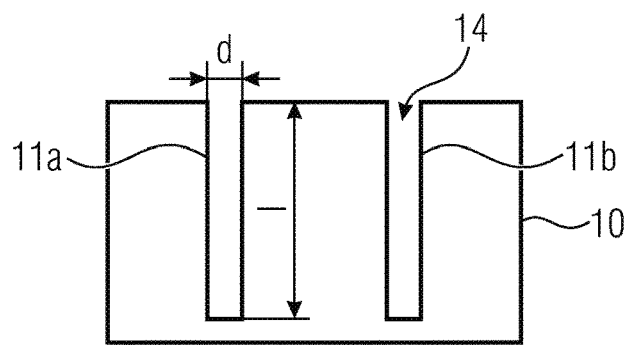

FIG. 1B shows a lateral view of the substrate 10. As is shown in the example of the left-hand cavity 11a, the cavity 11a comprises a depth, or depth of penetration, of the length l as well as a lateral extension of the width d. The ratio of the length l to the width d is also referred to as an aspect ratio l/d.

In accordance with the invention, the cavity 11a has a depth l of at least 50 μm. In accordance with some embodiments, the cavity 11a may also have an aspect ratio l/d of at least 4:1 or of at least 6:1 or even of at least 10:1. This means that the depth l is at least four times or six times or even ten times as large as the lateral extension of the width d.

With regard to the aspect ratio and the depth of penetration l, what was said above incidentally also applies to the right-hand cavity 11b and to any further cavities which may exist within the substrate 10.

The cavities 11a, 11b each comprise an opening 14 toward their surroundings. Particles may be filled into said openings 14, for example.

Figure 1C:
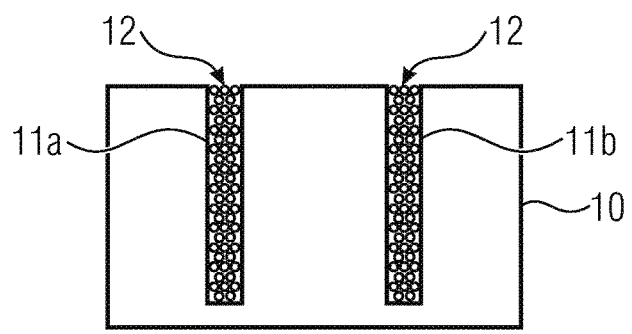

As is shown in FIG. 1C, the cavities 11a, 11b are filled with magnetic particles 12. In the embodiment depicted, the cavities 11a, 11b are filled up to the rim, so that said cavities roughly reach up to the upper edge of the opening 14 of the cavity 11a, 11b.

At points of contact, said magnetic particles 12 come into contact with one another, cavities forming between the points of contact. In accordance with the invention, the magnetic particles 12 are coated by using a coating process, e.g. an ALD (Atomic Layer Deposition) process.

On account of said coating, at least some of the magnetic particles 12 connect to one another at their points of contact, in that the cavities are at least partly penetrated by the layer produced during coating. Advantageously, as a result of said coating all of the magnetic particles 12 connect to one another at their points of contact in that the cavities are fully penetrated by the layer generated during coating.

Figure 1D:
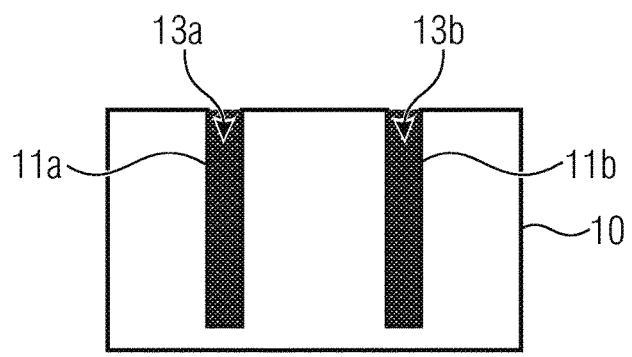

FIG. 1D shows the result of the coating process. The interconnected magnetic particles 12 form a solidified porous structure 13, which also is magnetic. Thus, a respective magnetic porous structure 13a, 13b is formed in each cavity 11a, 11b.

In the embodiment shown in FIG. 1D, all of the magnetic particles 12 which previously were present as a loose mixture of particles have now been connected to one another by the coating. However, it is also feasible for only some of the loose particles 12 to be connected to one another by the coating. If non-connected loose particles 12 are to remain, they may also be removed again from the cavity 11a, 11b if need be.

The interconnected magnetic particles 12 form a magnetic porous structure 13.

In some embodiments, the cavities 11a, 11b may have an aspect ratio of 10:1 and more. In addition, the cavities 11a, 11b may have a depth (of penetration) of 75 μm and more, of 85 μm and more, or of 100 μm and more. This is a clear difference as compared to magnetic coatings which have been applied onto the substrate by means of common deposition processes. Due to the inventive minimum depths of penetration in connection with the above-mentioned high aspect ratios, it is possible to generate magnetic porous structures 13 which have high magnetic flux densities, the amounts of which are many times higher than those of conventionally deposited structures.

Figure 2A:
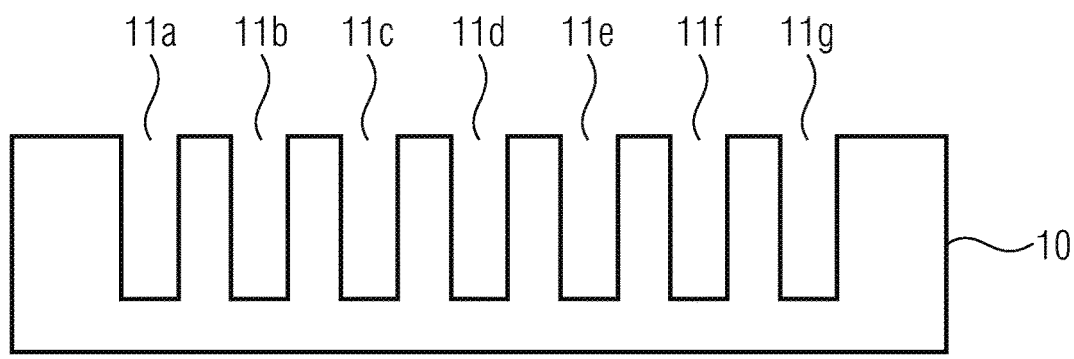
FIGS. 2A to 2C show further graphic pictures for describing the inventive method as well as lateral views of an inventive device.

FIG. 2A shows a further lateral view of a device for graphically illustrating embodiments of the inventive method. The substrate 10 depicted here comprises several (seven, by way of example) cavities 11a to 11g.

Figure 2B:
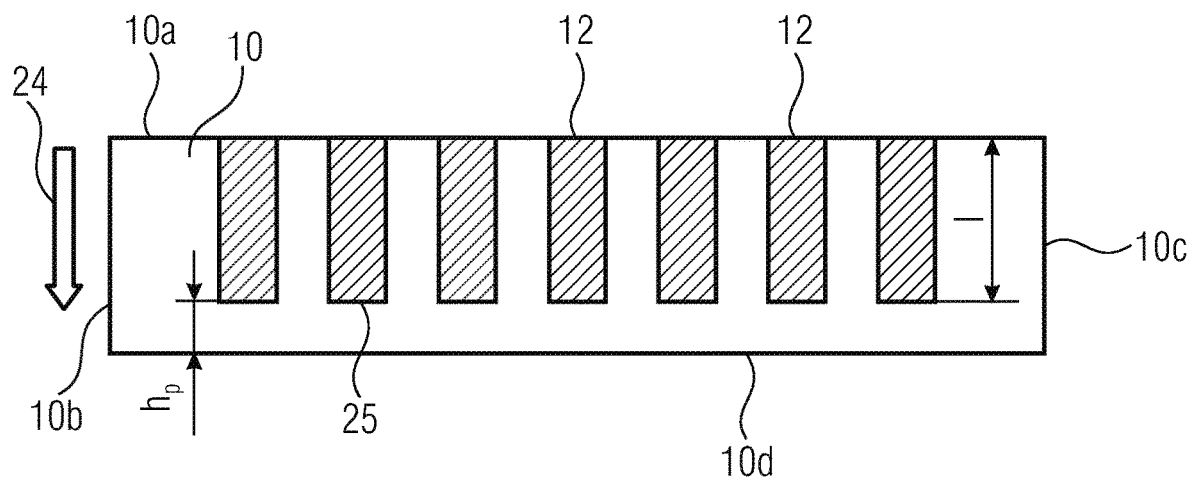

As can be seen in FIG. 2B, the substrate 10 comprises an upper side 10a, a left-hand side 10b, a right-hand side 10c, and a lower side 10d. The cavities 11a to 11g extend in a direction of depth (see arrow 24) from the upper side 10a of the substrate 10 to its opposite lower side 10d while exhibiting a depth of penetration l' of at least 50 μm. Each cavity 11a to 11g has a deepest point 25 down to which the cavity 11a to 11g extends into the substrate 10 at a maximum.

The cavities 11a to 11g extend into the substrate 10 to such a depth that a residual thickness $h_p$ which remains, in the direction of depth 24, between the deepest point 25 of the cavity 11a to 11g and that outer side, here the lower side 10d, which is opposite the deepest point 25, of the substrate 10 amounts to from approx. 10 μm to 100 μm.

In other words, the substrate 10 has a residual thickness $h_p$ on its side 10d which is located opposite the cavities 11a to 11g. Said residual thickness $h_p$ has a dimension of from 10 μm to 100 μm.

All of the cavities 11a to 11g are filled up with loose magnetic particles 12. Introduction of the loose magnetic particles 12 into the cavities 11a to 11g may be performed by using a doctor blade on them, for example. Advantageously, the loose magnetic particles 12 comprise a hard magnetic material, in particular NdFeB (neodymium-iron-boron). Subsequently, the loose magnetic particles 12 are coated by using a coating process, e.g. an ALD process.

Figure 2C:
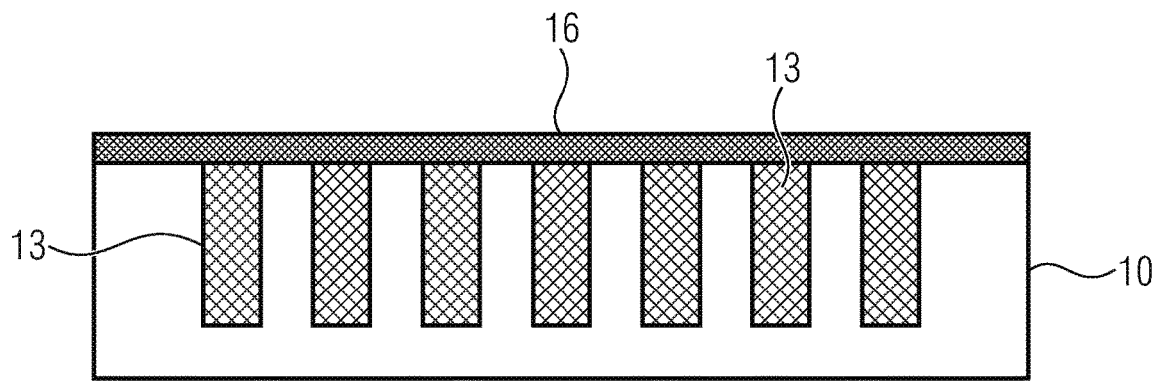

As can be seen in FIG. 2C, the coating process results in that the loose magnetic particles 12 connect, or solidify, to form a magnetic porous structure 13. In addition, an additional coating 16 may apply onto the substrate 10. More specifically, the additional coating 16 is applied onto that side of the substrate 10 which comprises the respective opening 14 of the cavities 11a to 11g, i.e. in the present case onto the upper side 10a of the substrate 10. The additional coating 16 thus extends across the cavities 11a to 11g filled with the magnetic particles 12 so as to seal the cavities 11a to 11g therewith.

The additional coating 16 may be applied onto the substrate 10 by means of known methods, e.g. by means of chemical vapor deposition, sputtering and the like. The additional coating 16 may protect and/or seal the cavities 11a to 11g against penetration of, e.g., dirt, dust, humidity and the like.

The additional coating 16 may also be applied onto the substrate 10 by means of, e.g., sputtering, electrodeposition or PECVD, and offers several advantages. To achieve reliable protection against corrosion, the porous magnetic structures 13 should be sealed on all sides, advantageously hermetically, on the one hand. On the other hand, considerable improvement in the magnetic properties is achieved when the magnetic flux of the magnetic porous structures 13 may be closed by applying a soft magnetic additional coating 16, e.g. Fe or NiFe. The additional coating 16 may also comprise several layers, e.g. a dielectric layer and a soft magnetic layer.

As was mentioned at the outset, the inventive arrangement may comprise an aspect ratio l/d, which may amount to at least 4:1 or at least 6:1 or, in some embodiments, at least 10:1. An advantage of embodiments of the inventive arrangement of FIGS. 1 and 2 as compared to conventional technology consists in that, e.g., the high aspect ratio l/d of up to 10:1 and more causes a high magnetic flux density. The flux density may further be enhanced by introducing hard magnetic particles 12 (e.g. NdFeB) into the cavities 11 and optionally by providing an additional, e.g. soft magnetic, coating 16 (FIG. 2C).

With electrodeposited or sputtered magnetic structures as are described in conventional technology, the aspect ratios l/d mostly remain clearly below 1, however.

Figure 3:
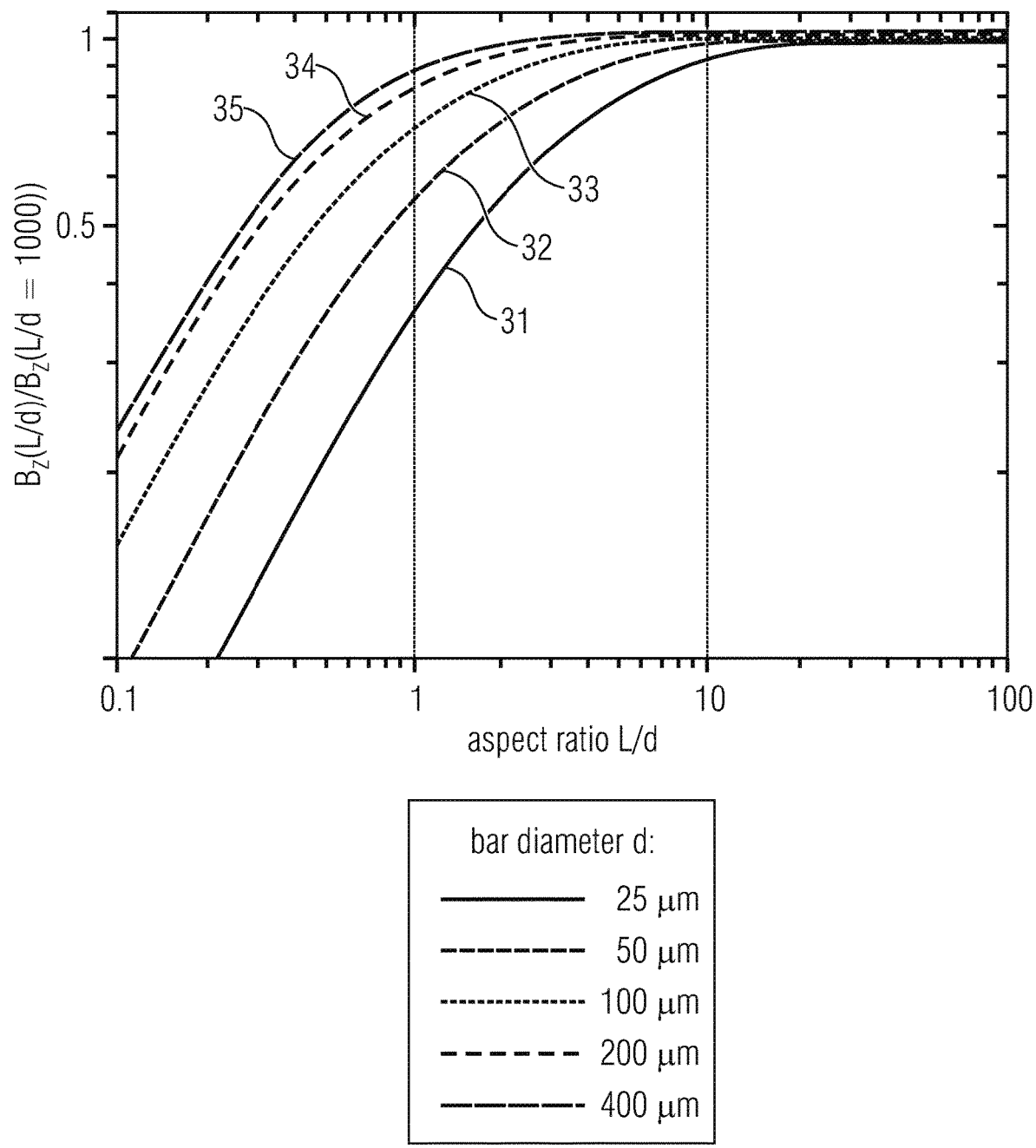
FIG. 3 shows a diagram depicting the normalized magnetic flux density versus the aspect ratio.

As depicted in FIG. 3, the high aspect ratio l/d of at least 4:1, 6:1 or 10:1 of the above-mentioned embodiments may ensure that a high magnetic flux density may be implemented in the surroundings of the magnetic porous structures 13.

In FIG. 3, the normalized axial magnetic flux density B, at a distance a=100 μm from a bar magnet (corresponds to the deepest point 25 of the cavity 11) is plotted on the y axis. The aspect ratio l/d, by way of example for a bar magnet as a function of its length L to its diameter (rod, or bar, diameter) d, is plotted on the x axis, wherein various diameters d of between 25 μm and 400 μm are considered.

The curve 31 shows the magnetic flux density versus the aspect ratio for a bar magnet having a diameter of 25 μm. The curve 32 shows the magnetic flux density versus the aspect ratio for a bar magnet having a diameter of 50 μm. The curve 33 shows the magnetic flux density versus the aspect ratio for a bar magnet having a diameter of 100 μm. The curve 34 shows the magnetic flux density versus the aspect ratio for a bar magnet having a diameter of 200 μm. The curve 35 shows the magnetic flux density versus the aspect ratio for a bar magnet having a diameter of 400 μm.

For example, with a bar magnet having a width of 50 μm (comparable to a magnetic porous structure 13), the increase in the aspect ratio l/d of from 0.1 to 10 results in an increase in the magnetic flux density by an order of magnitude. By using the new, particle-based manufacturing method, such aspect ratios l/d are readily possible especially for small magnetic porous structures (d<100 μm). In comparison, aspect ratios of 0.1 are typical for galvanic magnetic layers. Layer thicknesses of 1-20 μm are typical electroplating thicknesses. A layer thickness of 50 μm would be already very large in terms of electroplating thicknesses and would be very hard to implement technically since any follow-up processes performed at elevated temperatures may easily result in stress-induced delamination of the galvanic structures. However, since the magnetic effect depends on the volume, the invention proposes provision of structures having dimensions (l) of at least 50 μm or also more than 100 μm, for example.

The cavities 11a to 11g are introduced into the substrate 10 advantageously while using a dry-etching process. Here, the substrate 10 may comprise silicon, for example. If the etching is performed in a time-controlled manner, etching may be performed down to a residual thickness $h_p$ of 50 to 100 μm. The depths of the etched cavities 11 and, thus, also $h_p$ may vary considerably across the substrate 10, however. A residual thickness $h_p$ which is considerably smaller and better defined may be achieved if the etching process is limited by a stop layer. In order to accurately control the depth of penetration of an etchant, the substrate 10 may therefore additionally comprise an etch stop layer.

Figure 4A:
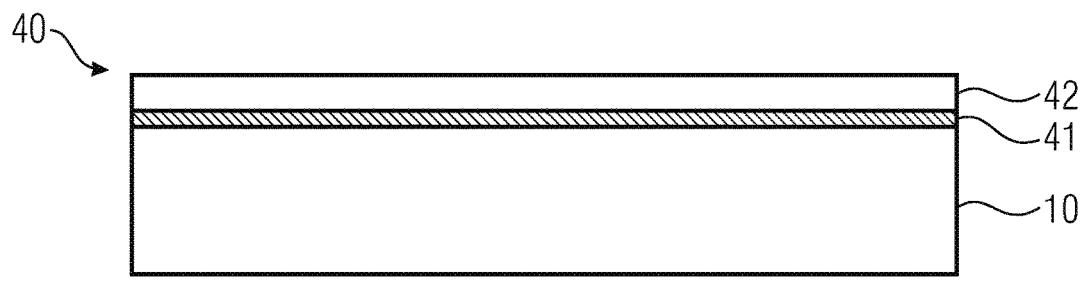
FIGS. 4A to 4D show further graphic pictures for describing the inventive method as well as lateral views of an inventive device.
Figure 4B:
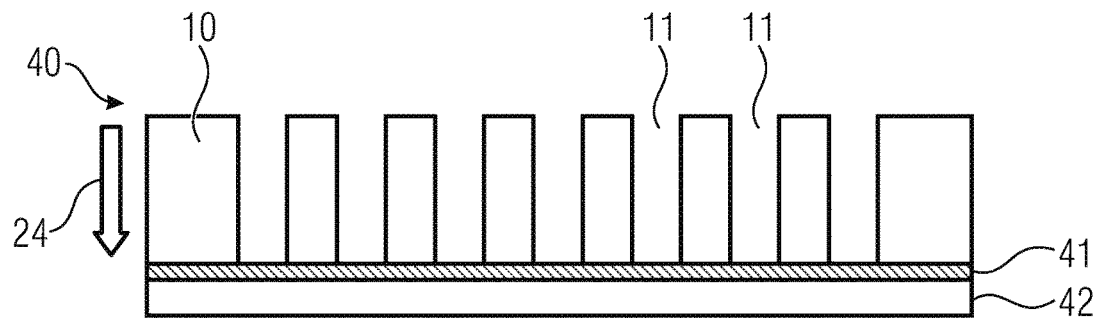

FIG. 4A shows such a substrate 10 which comprise an etch stop layer 41. As can be seen in FIG. 4B, the etch stop layer 41 extends essentially orthogonally to the direction of depth 24 of the cavities 11.

However, one cannot only achieve a residual thickness $h_p$ which is better defined, but also a residual thickness $h_p$ which is considerably smaller as compared to conventional technology. For example, an Si wafer having buried etch stop layers 41 made of $SiO_2$ in the form of a so-called SOI (Silicon-On-Insulator) substrate may be used.

FIGS. 4A to 4D describe manufacturing of an inventive magnetic device 40 while using such an SOI substrate. The substrate 10 comprises an etch stop layer 41 and an SOI layer 42 arranged above it.

The etch stop layer 41 is arranged between the substrate 10 and the SOI layer 42. The etch stop layer 41 may comprise silicon oxide or silicon nitride. However, the etch stop layer 41 may also comprise a metal, a metal oxide or a metal nitride. In principle, the layer thickness of the buried etch stop layer 41 may range from 100 nm to 1 μm.

The SOI layer 42 may comprise a layer thickness ranging from 10 μm to 100 μm or a layer thickness ranging from 50 μm to 100 μm. The distance $h_p$ might thus be reduced to few micrometers while using such an SOI substrate, i.e. a substrate 10 having an etch stop layer 41 and an SOI layer 42. However, to ensure sufficient mechanical stability, SOI layer thicknesses ranging from 1 μm to 100 μm are useful. The thickness of the SOI layer 42, which may consist of monocrystalline silicon, for example, may be set to almost any value.

FIG. 4A shows an SOI substrate comprising a substrate 10, an SOI layer 42 and an etch stop layer 41 arranged between the substrate 10 and the SOI layer. Prior to introducing the cavities 11, the substrate 10 is initially turned over, see FIG. 4B.

FIG. 4B shows how the cavities 11 are introduced into the substrate 10 while using an etching method. The etchant etches the cavities 11 down to the etch stop layer 41.

Figure 4C:
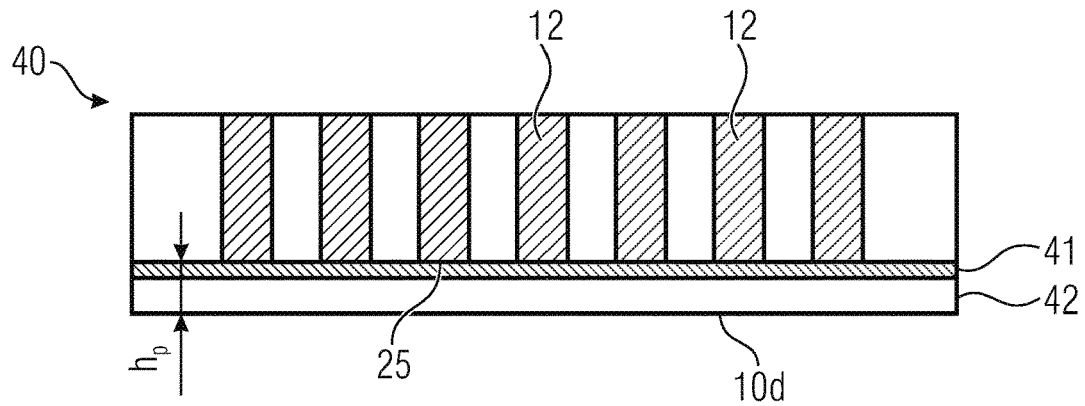

FIG. 4C shows how the cavities 11 are filled with loose magnetic particles 12. In the example shown, NdFeB particles were introduced into the cavities 11 by using a doctor blade on them. Subsequently, the loose particles 12 are solidified while using an ALD process. FIG. 4C also clearly shows that the distance between the deepest point 25 of the cavities 11 and the outer side 10d of the substrate 10, i.e. the residual thickness $h_p$, may be set by means of the buried oxide layer (SOI layer) 41.

Figure 4D:
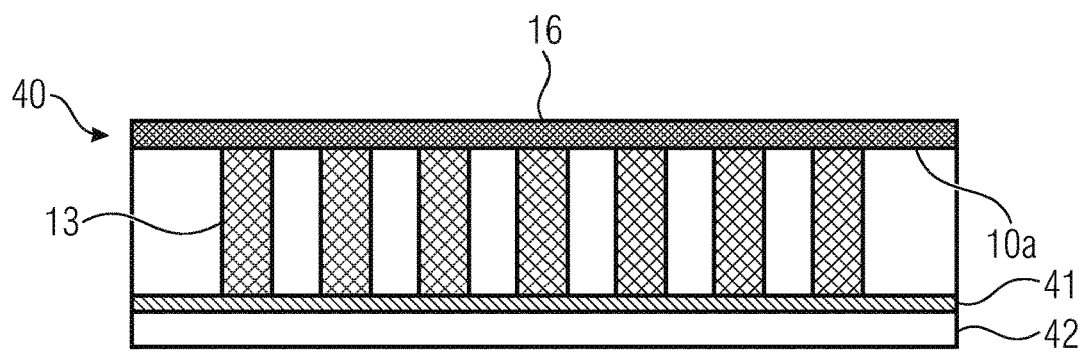

FIG. 4D depicts the particles 12 which have solidified under the application of the coating method. More specifically, the magnetic loose particles 12 have solidified to form magnetic porous structures 13. Moreover, an additional coating 16, which in turn may comprise one or more layers, is applied onto the substrate 10, specifically onto that side 10a of the substrate 10 which comprises the openings 14 of the cavities 11.

The manufacturing process of FIGS. 4A to 4D is not limited to SOI substrates. Many combinations of materials are feasible for setting the residual thickness $h_p$ in this manner. For example, a thick polysilicon layer may be used instead of a monocrystalline SOI layer 42. At high temperatures, polysilicon may be deposited, e.g., with thicknesses of up to 50 μm. likewise, one might use an electrodeposited copper layer. Besides silicon oxide, silicon nitride, various metals and their oxides and nitrides also come into question for being used as the buried etch stop layer 41.

FIGS. 5A to 5D each show a further lateral view of a device for graphically illustrating embodiments of the inventive method. Said embodiment differs from the above-discussed embodiments in that the cavities 11 each comprise, at their portions which are lower when viewed in the direction of depth 24, a tapered portion introduced into the substrate while using a wet-chemical etching process.

In order to further increase the field line density, the cavities 11 to be filled may be tapered in the area of their deepest point 25. This is possible, e.g., by anisotropically etching a trench having slanted sidewalls in aqueous KOH or TMAH solution prior to dry etching.

Figure 5A:
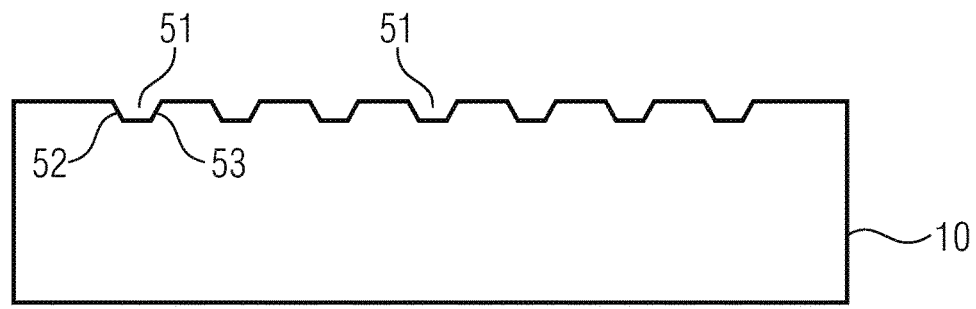
FIGS. 5A to 5D show further graphic pictures for describing the inventive method as well as lateral views of an inventive device.

FIG. 5A shows a substrate 10 consisting of silicon, for example. Trenches 51 in the form of truncated pyramids are introduced into the substrate 10, e.g. by anisotropic etching in an aqueous KOH or TMAH solution. The trenches 51 formed like truncated pyramids comprise slanted sidewalls 52, 53.

Figure 5B:
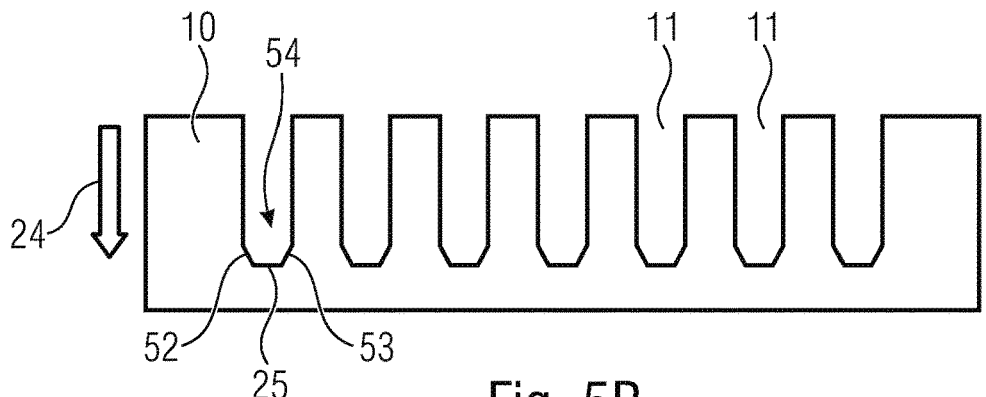

As depicted in FIG. 5B, the trenches 51 are subsequently deepened by means of dry etching or any other suitable method. In this manner, the cavities 11 again form within the substrate 10. The previously formed shape of the type of a truncated pyramid is maintained for the most part here, however. Specifically, this shape of the type of a truncated pyramid continues in the direction of depth during dry etching, so that the cavities 11 have the previously described slanted sidewalls 52, 53 at their bottommost ends 25.

In combination with the respectively deepest point 25 of a cavity 11, the slanted sidewalls 52, 53 form a tapered portion. Thus, a tapered portion 25, 52, 53 is formed in a portion 54 of the cavities 11 which is at the bottom/which is the lowest portion when viewed in the direction of depth 24. In other words, the cavities 11 have a tapered portion 25, 52, 53 at their portion 54 which is lower when viewed in the direction of depth 24.

Figure 5C:
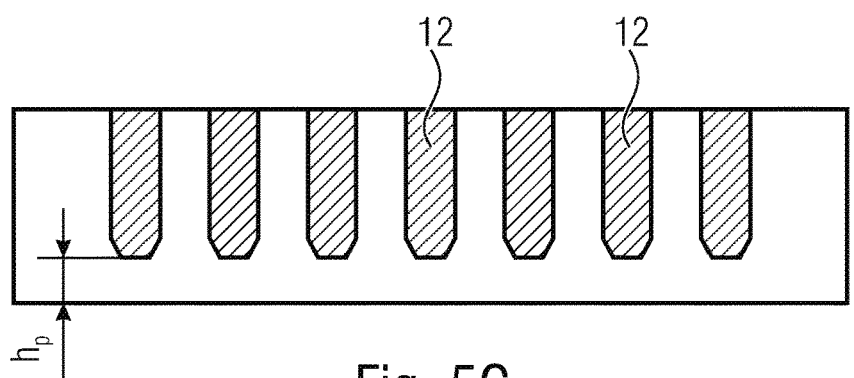

FIG. 5C shows how the cavities 11 are then filled with loose magnetic particles 12 again.

Figure 5D:
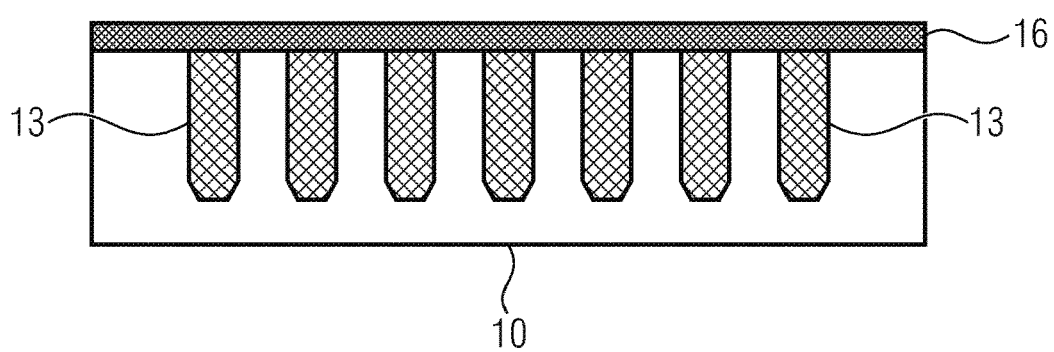

As depicted in FIG. 5D, the loose magnetic particles 12 solidify to form magnetic porous structures 13 when a coating process is used. Since the magnetic porous structures 13 adopt the shape of the cavities 11 within which they are located, the magnetic porous structures 13, too, will have a tapered portion at their respective lower portions.

Moreover, an additional coating which may comprise several layers may be applied onto the substrate 10 in the present case, too.

In the embodiment described with reference to FIGS. 5A to 5D it may occur for the shape of the type of a truncated pyramid of the, e.g., anisotropically etched trenches 51 to be falsified/distorted (become blunt) due to dry etching being performed for a long time, and for the depth I of the cavities 11 and, therefore, also the residual thickness $h_p$, to strongly vary following dry etching.

To solve this problem, a substrate 10 having cavities 11 may alternatively also be produced, in the manner depicted in FIGS. 6A to 6D, by joining two pre-processed starting substrates 10', 10". Said starting substrates 10', 10" may then be processed further in accordance with FIG. 6D. Alternatively, the openings 61a, 61b within the second substrate 10" may also be generated following joining with the first substrate 10'.

Figure 6A:
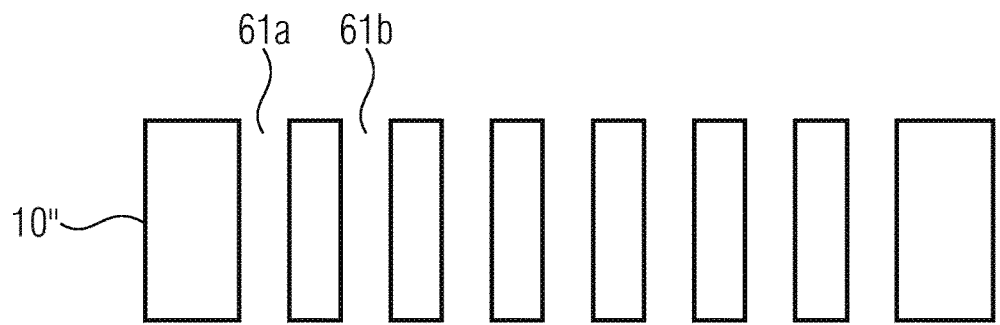
FIGS. 6A to 6D show further graphic pictures for describing the inventive method as well as lateral views of an inventive device, FIG. 7 show further graphic pictures for describing the inventive method as well as a lateral view of an inventive device.
Figure 6B:
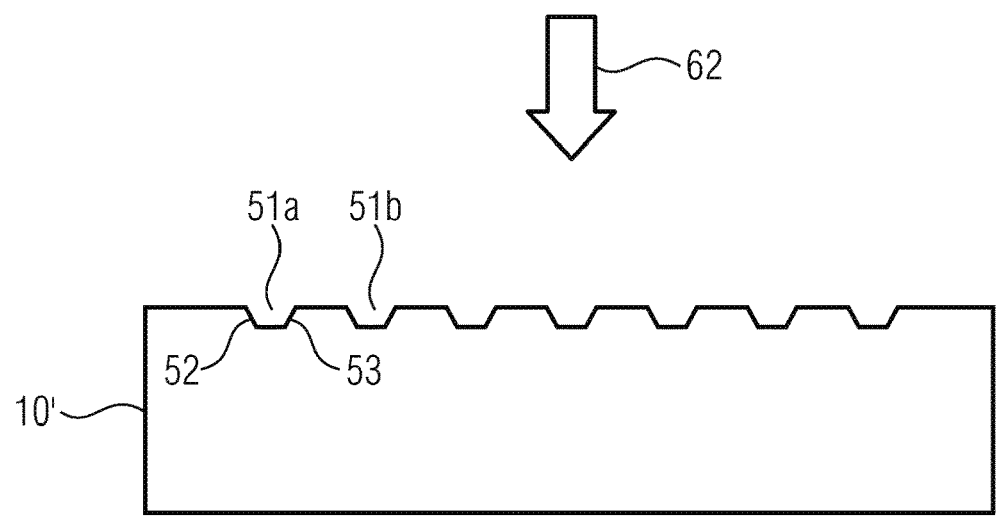

FIG. 6A shows a covering substrate 10", and FIG. 6B shows a base substrate 10'. The base substrate 10' essentially corresponds to the substrate 10 previously described with reference to FIG. 5A. The base substrate 10' depicted here also comprises trenches 51a, 51b having sidewalls 52, 53 which are slanted in each case, so that a shape of the type of a truncated pyramid results. The trenches 51a, 51b may also be referred to as cavities introduced into the base substrate 10'.

The covering substrate 10" depicted in FIG. 6A comprises openings 61a, 61b which extend completely through the covering substrate 10". As depicted by the arrow 62 shown between FIGS. 6A and 6B, both substrates, i.e. the base substrate 10' and the covering substrate 10", are joined to form one common substrate 10.

Figure 6C:
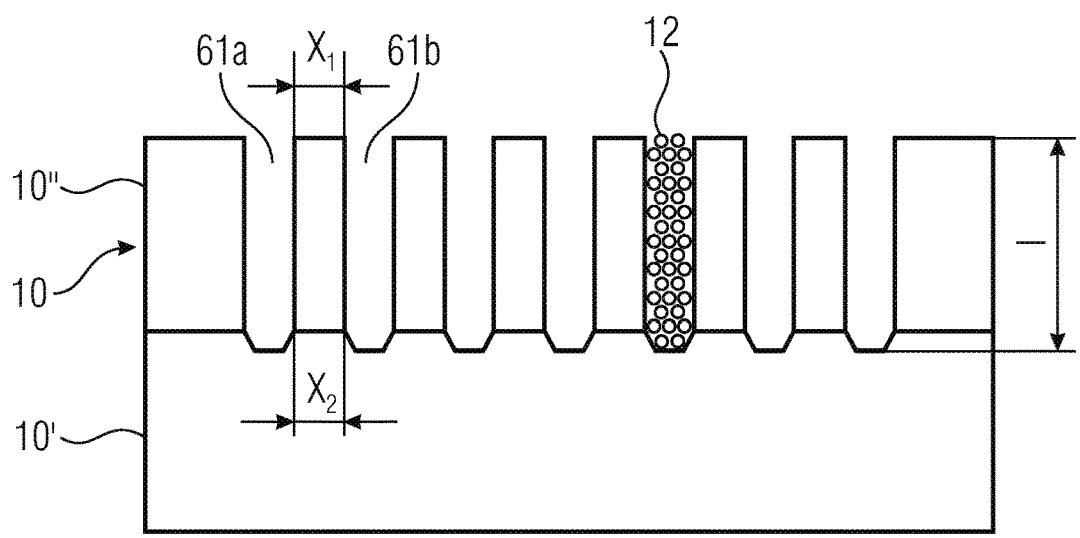

Such a joined substrate 10 is shown in FIG. 6C. In this embodiment, the substrate 10 therefore comprises a base substrate 10' and a covering substrate 10" joined therewith. Both substrates 10', 10" may be joined together, for example, by means of bonding, soldering or gluing to form one common substrate 10.

As can be seen, the openings 61a, 61b within the covering substrate 10" have the same mutual distance $X_1$ as do the distances $X_2$ of the cavities, or trenches, 51a, 51b within the base substrate 10'. Thus, when the covering substrate 10" is joined with the base substrate 10', the openings 61a, 61b within the covering substrate 10" become congruent with the cavities, or trenches, 51a, 51b of the base substrate 10'.

Thus, the base substrate 10' forms a common substrate 10 together with the covering substrate 10". The cavities, or trenches, 51a, 51b which are configured within the base substrate 10' and resemble truncated pyramids, here form, together with the continuous openings 61a, 61b formed within the covering substrate 10", the cavities 11 provided within the common substrate 10. In some embodiments of the invention, the cavities 11 may comprise a depth l of at least 50 μm at an aspect ratio l/d of at least 4:1 or 6:1 or 10:1.

In addition, said joined cavities 11 each comprise a tapered portion at their respectively lower portion when viewed in the direction of depth 24, as was already explained above with reference to FIGS. 5A to 5D.

In accordance with the invention, these two-part, as it were, cavities 11 are also refilled with loose magnetic particles 12 and are subsequently solidified to form magnetic porous structures 13 while using a coating process.

Figure 6D:
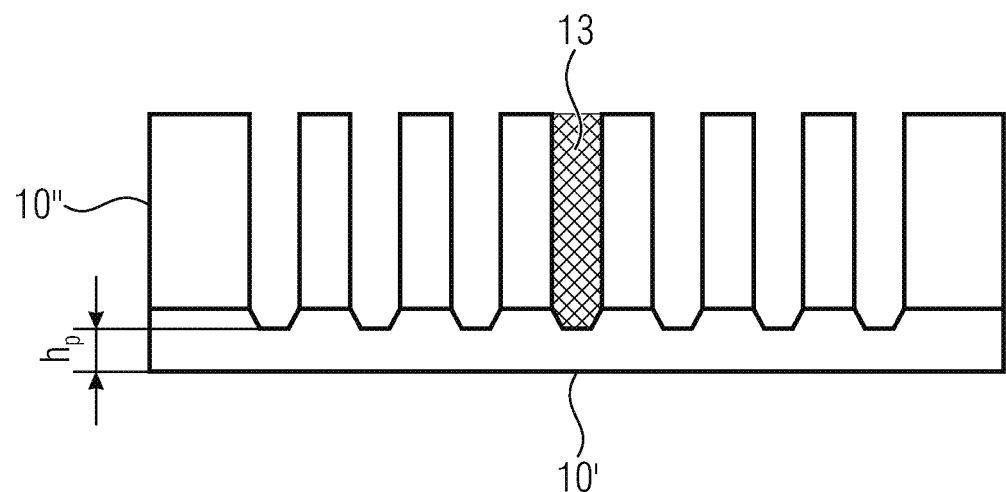

FIG. 6D shows a further process step wherein the above-mentioned loose magnetic particles 12 are solidified to form the magnetic porous structure 13, on the one hand. On the other hand, the base substrate 10' was thinned back to a residual thickness $h_p$. This may be effected, for example, by grinding and/or polishing or the like.

It may be advantageous to use silicon as the starting material for the base substrate 10' when producing cavities 11 in accordance with FIGS. 6C and 6D, so as to define the magnetic pole exit ends of the magnetic porous structures 13 as accurately as possible, on the one hand, and to obtain a planar and corrosion-resistant outer surface, on the other hand. However, the covering substrate 10" comprising the continuous openings 61a, 61b might also consist of plastic for reasons of cost or in order to simplify production.

If the covering substrate 10" comprises plastic, the continuous openings 61a, 61b might be introduced into the covering substrate 10" by drilling, for example. If the covering substrate 10" comprises silicon, the continuous openings 61a, 61b might be introduced into the covering substrate 10" by using a dry-etching method, for example. If the base substrate 10' comprises silicon, the cavities, or trenches, 51a, 51b might be introduced into the base substrate 10' by using, for example, a wet-chemical etching method, e.g. by anisotropic etching of silicon in an aqueous KOH or TMAH solution.

As was already mentioned at the outset, the tapered portions 25, 52, 53 in the lower portions 54 of the cavities 11 ensure that the field line density present at the exit ends of the magnetic porous structures 13, which, as we know, adapt to the respective shape of the cavities 11 and therefore also comprise a tapered portion, is increased.

Figure 7:
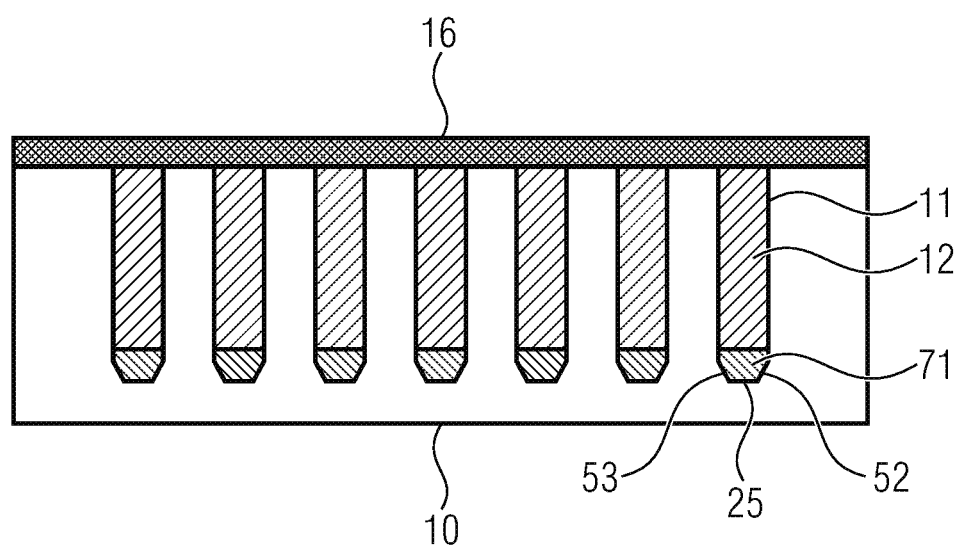

A further increase in the field line density may be achieved by implementing the tapering part of the magnetic porous structures 13 from a material having a higher saturation magnetization. As shown in FIG. 7, for this purpose the tapered portion 25, 52, 53 of the cavities 11 may be filled with, e.g. ferromagnetic, material 71 having a higher saturation magnetization as compared to that of the magnetic particles 12.

The device shown in FIG. 7 may be produced in two steps, for example, wherein the cavities 11 are at first partially filled with iron powder and are subsequently filled up with NdFeB powder. Thus, the iron powder will deposit within the tapered portions 25, 52, 53 of the cavities 11, whereas the remaining cavities 11 are filled with NdFeB particles.

FIG. 8A shows a top view of a test structure 81. FIG. 8B shows a sectional view of the test structure 81 along the intersection line A-A. The test structure 81 comprises several cavities 11 spaced apart from one another. For testing purposes, the cavities 11 were once filled with NdFeB particles and once filled with iron particles, and in both cases were solidified to form magnetic porous structures 13 by means of an ALD process.

FIG. 9 shows the B-H curves for the test structures 81 filled differently in each case. The curve 91 was generated by using iron particles. The hysteresis curve 92 represents the behavior of cavities 11 filled with NdFeB particles. According to that, one might achieve an increase in the field line density to at least double the amount by filling up tapering portions with iron particles rather than with NdFeB particles.

Figure 10A:
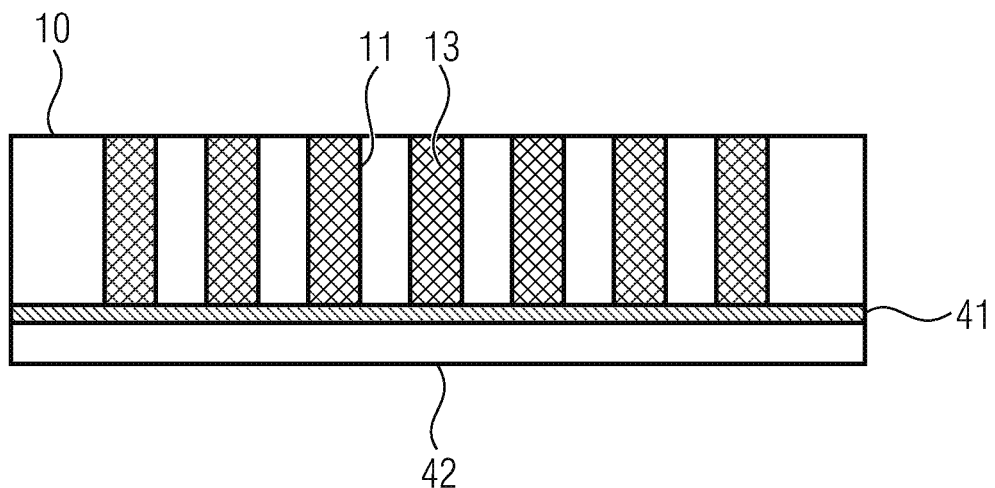
FIGS. 10A to 10B show further graphic pictures for describing the inventive method as well as lateral views of an inventive device.
Figure 10B:
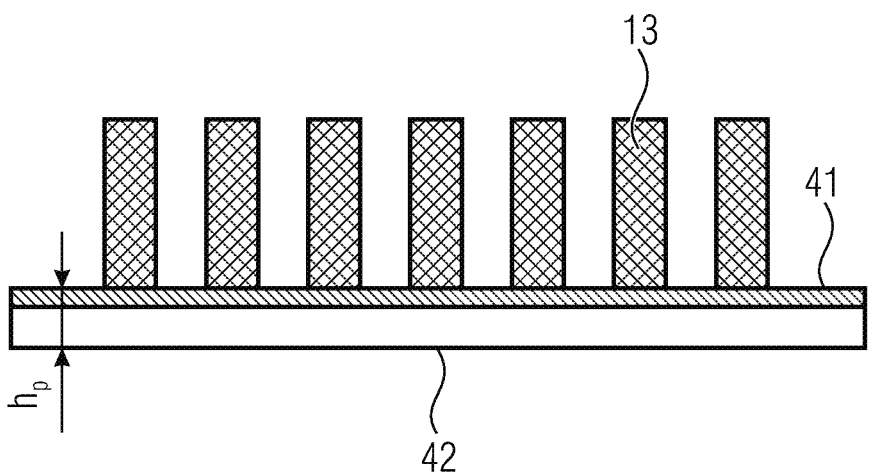

FIGS. 10A and 10B show a further device for graphically illustrating a further embodiment of the inventive method, wherein the substrate 10 is removed in portions or is fully removed so as to expose at least portions of the magnetic porous structures 13.

Essentially, FIG. 10A shows the device described above with reference to FIG. 4C, wherein an SOI substrate is provided which comprises a silicon substrate 10, an SOI layer 42 and an etch stop layer 41 buried therebetween. The magnetic particles 12 filled into the cavities 11 were already solidified to form the magnetic porous structures 13.

FIG. 10B shows a further process step wherein the silicon substrate 10 has been fully removed while the etch stop layer 41 and the SOI layer 42 have been maintained. The silicon substrate 10 may be removed, e.g., by etching in the XeF$_2$ gas phase. By removing the silicon substrate 10, the magnetic porous structures 13 are fully exposed.

By partially removing the substrate 10, which evidently may also comprise materials other than silicon, the magnetic porous structures would accordingly be only partly exposed.

By exposing the magnetic porous structures 13, the device may have mechanical flexibility imparted thereon. The layer structure comprising the etch stop layer 41 and the SOI layer 42 may here also serve as a flexible carrier layer. Moreover, a coating of, e.g., soft magnetic material might be applied onto the free-standing portions of the magnetic porous structures 13.

Figure 11A:
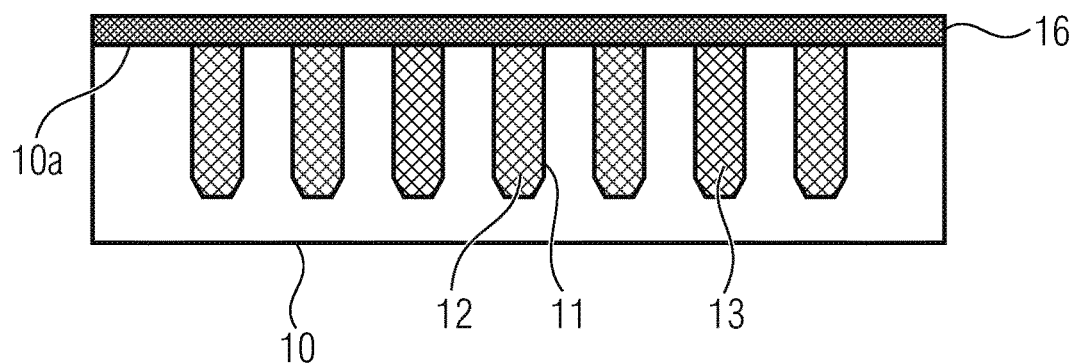
FIGS. 11A to 11O show further graphic pictures for describing the inventive method as well as lateral views of an inventive device.
Figure 11B:
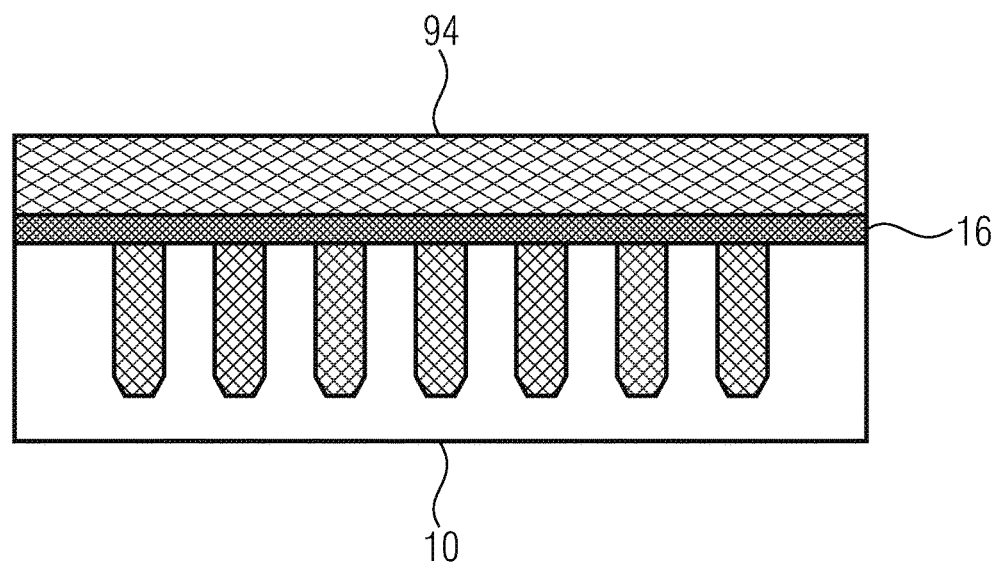
Figure 11C:
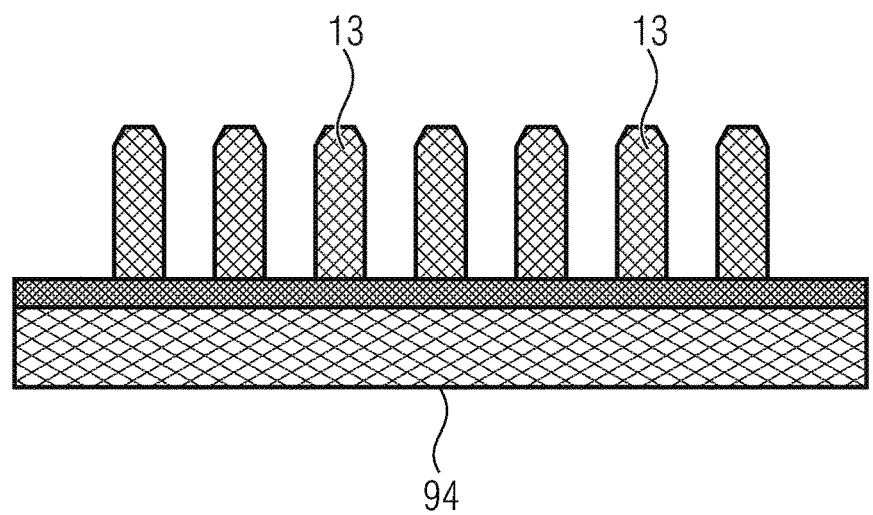

FIGS. 11A, 11B and 11C show a feasible alternative to producing such free-standing structures.

FIG. 11A shows a device which essentially corresponds to the device previously discussed with reference to FIG. 2C. The substrate 10 comprises cavities 11 filled up with loose magnetic particles 12, which in turn have been solidified to form magnetic porous structures 13 while using a coating process. An additional coating 16, which may comprise several layers, has been applied onto that side 10a of the substrate 10 which comprises the openings 14 of the cavities 11.

In FIG. 11B, a advantageously flexible carrier 94 of, e.g., plastic or metal is arranged on that side of the additional coating 16 which faces away from the substrate 10. The carrier 94 may be arranged on the additional coating 16 by means of bonding, soldering or gluing, for example.

Subsequently, the substrate 10 may be removed completely or at least in portions, e.g. by means of etching in the XeF$_2$ gas phase. As is shown in FIG. 11C, a flexible device having free-standing magnetic porous structures 13 is thus obtained. The device has been rotated by 180° as compared to the picture in FIG. 11B, so that the magnetic porous structures 13 point upward.

Figure 12A:
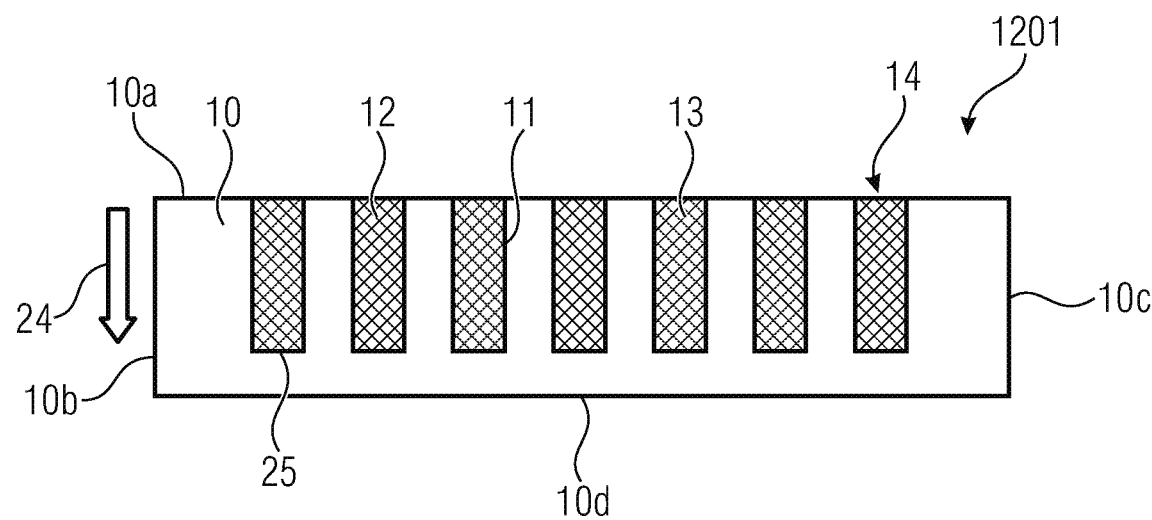
FIG. 12A shows a further graphic picture for describing the inventive method as well as a lateral view of an inventive device.
Figure 12B:
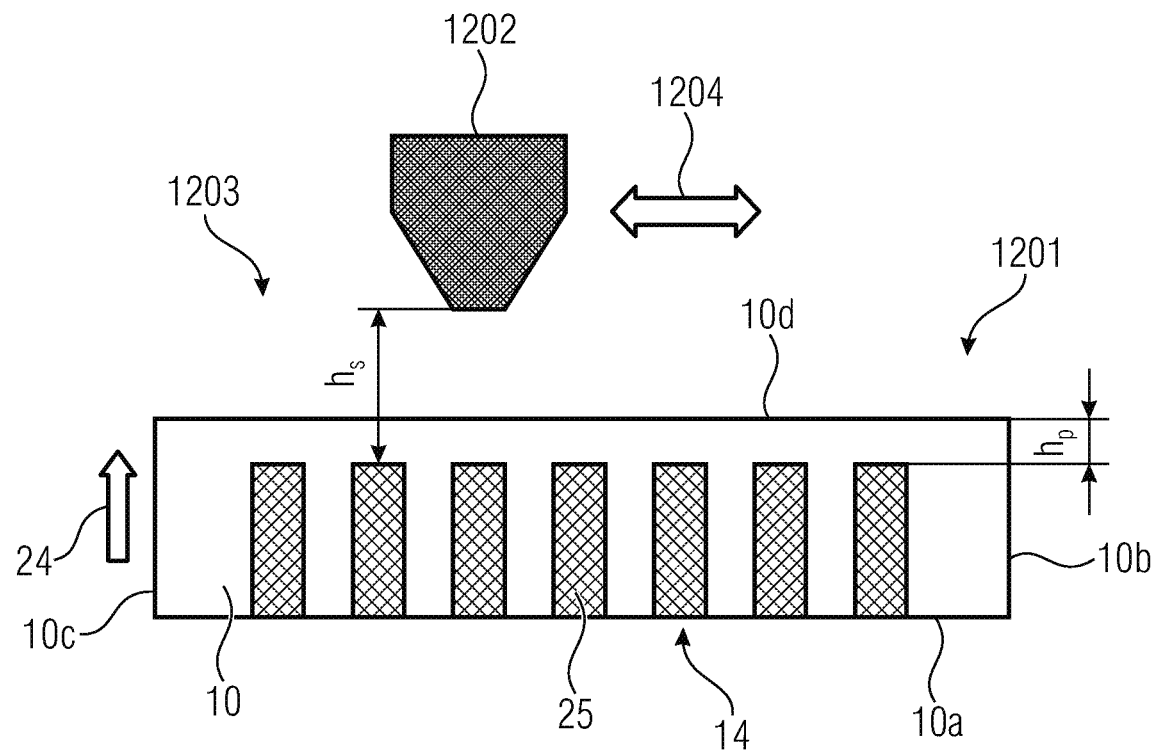
FIG. 12B shows a further graphic picture for describing the inventive method as well as a lateral view of an inventive system comprising an inventive device and a magnetic sensor.

FIGS. 12A and 12B show an inventive device 1201 and a system 1203 comprising an inventive device 1201 and a magnetic sensor 1202, respectively.

At first, FIG. 12A shows a substrate 10 having several mutually spaced-apart cavities 11. The cavities 11 have loose magnetic particles 12 located therein which have been solidified to form magnetic porous structures 13 while using a coating process.

As was already explained above with reference to FIG. 2B, the substrate 10 comprises an upper side 10a, an opposite lower side 10d as well as a left-hand and a right-hand side 10b, 10c. The upper side 10a is that side of the substrate 10 from which the cavities 11 are introduced into the substrate 10. This is why the openings 14 of the cavities 11 are located on the upper side 10a of the substrate 10.

The cavities 11 extend from the upper side 10a a direction of depth 24 through the substrate 10 and to the lower side 10d in. Each cavity 24 has a lower portion 25 located in said direction of depth 24.

Since the inventive device 1201 comprises at least two magnetic porous structures 13, it may be used as a magnetic measuring bar. FIG. 12B shows utilization of the inventive device 1201 as a magnetic measuring bar. A system 1203 is shown here which comprises a magnetic sensor 1202 in addition to the inventive device 1201.

The magnetic sensor 1202 is configured to determine the magnetic field strength emanating from the device 1201 in that it is moved past the porous magnetic structures 13 at a distance from the substrate 10 and along an outer side 10d of the substrate 10, specifically on that outer side 10d of the substrate 10 which is located opposite the opening 14 of the respective cavity 11.

As becomes clear from a comparison of FIGS. 12A and 12B, the magnetic measuring bar 1201 is rotated by 180°, i.e. the lower side 10d of the substrate 10 is located opposite the magnetic sensor 1202. The lower side 10d of the substrate 10 may now be referred to as the upper side, and the upper side 10a of the substrate 10 may now be referred to as the lower side.

Accordingly, the direction of depth 24 also points in the opposite direction. However, the direction of depth 24 still continues to describe that direction in which the cavities 11 have been introduced into the substrate 10. Thus, each cavity 11 continues to comprise a portion 25 which is lower when viewed in the direction of depth 24.

A residual thickness $h_p$ is present between said portion 25, which is lower when viewed the direction of depth, and that outer side of the substrate 10, namely the lower side 10d, which is closest to said portion.

The magnetic sensor 1202 is arranged opposite said very outer side 10d of the substrate 10. The magnetic sensor 1202 is spaced apart from said substrate side 10d by a measure of $h_s$. As is indicated by the arrow 1204, the magnetic sensor 1202 may be moved relative to the device 1201, i.e. relative to the magnetic porous structures 13, at a roughly constant distance $h_s$. The magnetic sensor 1202 here moves essentially in parallel with the outer side 10d, to which it is opposite, of the substrate 10.

Since the distance of the magnetic sensor 1202 from the opposite outer side 10d of the substrate 10 is advantageously within the range of few micrometers, it is desirable to design the surface of the outer side 10d of the substrate to be as planar as possible.

To achieve this, in conventional magnetic measuring bars of conventional technology, the upper side 10a of the substrate 10, i.e. that outer side 10a of the substrate 10 which comprises the openings 14 of the cavities, is coated with an additional coating. Said additional coating is then planarized by means of grinding and polishing.

In accordance with the inventive utilization of the device 1201 as a magnetic measuring bar it is suggested to simply turn over the substrate 10, as shown in FIGS. 12A and 12B. Since the back 10d of the substrate 10 is typically planar, said back 10d of the substrate 10 may be used as that side which is located opposite the magnetic sensor 1202. In accordance with the invention, there is therefore no more need to apply an additional coating onto that side of the substrate 10 which comprises the openings 14 of the cavities 11 and to subsequently planarize said coating. Moreover, with the inventive device 1201 the magnetic porous structures 13 are simultaneously protected against contamination and corrosion.

In principle, all of the devices described above with reference to FIGS. 1 to 11 may be employed as magnetic measuring bars in accordance with FIG. 12B.

An advantage here is that the vertical distance $h_s$ between the sensor 1202 and the pole exit ends 25 of the porous, hard magnetic pole structures 13 may be reduced. The smaller $h_s$, the higher the magnetic flux density at the location of the sensor. The distance measure $h_s$ is limited, inter alia, by the distance $h_p$ between the magnetic porous structures 13 and the surface 10d of the magnetic measuring bar 1201. In addition to the upper side 10d of the substrate 10, this may be layers, e.g., which protect the measuring bar 1201 from mechanical damage and corrosion and which may easily have thicknesses of more than 200 µm in a conventional known magnetic measuring bar.

In the inventive magnetic measuring bar 1201, considerably smaller distances are possible. The cavities 11 defining the geometry of the magnetic porous pole structures 12 may be generated e.g. by means of dry etching (DRIE) in the case of an Si substrate 10. The residual thickness $h_p$, which remains in this case, with regard to the lower side 10d of the wafer 10 may be set to a measure of advantageously from 10 µm to 100 µm, which is clearly less than the above-mentioned thickness of 200 µm of conventional technology.

In general, both planar and three-dimensionally shaped substrates 10 made of most varied materials may be used for producing magnetic measuring bars 1201 on the basis of porous hard magnetic molded bodies 13, provided that the materials used withstand the inventive manufacturing processes explained above without being damaged.

As was described with reference to FIGS. 10B and 11C, it may also be advantageous to completely or partly remove the substrate 10 which has the porous hard magnetic molded bodies 13 embedded therein so as to impart flexibility on the magnetic measuring bar 1201.

If in said devices of FIGS. 10B and 11C, which may be used as magnetic measuring bars, the porous hard magnetic pole structures 13 form the upper side (i.e. that side which faces the sensor 1202) of the magnetic measuring bar, said pole structures 13 should advantageously be protected by taking additional measures. However, the embodiments depicted in FIGS. 10B and 11O which comprise free-standing magnetic porous structures 13 may also be rotated by 180° in turn so that the additional coating 94 (FIG. 11C) and/or the Si/SiO stack 41, 42 (FIG. 10B) forms the upper side (i. e. the side facing the sensor 1202).

In the case depicted in FIG. 10B, the Si/SiO stack 41, 42 of the SOI wafer may form the upper side of the magnetic measuring bar while providing a flexible carrier layer. A soft magnetic cover might additionally be applied once the substrate 10 has been removed.

The inventive magnetic measuring bar furthermore results in the following advantages:

Particularly high-performing magnetic materials having a high level of remanence and coercive field strength may be used as the measuring bar, such as NdFeB, which renders them considerably less sensitive toward external magnetic fields and elevated temperatures as compared to classic magnetic tapes while guaranteeing a stronger signal.

The measuring bar may be integrated both on planar substrates and on components comprising a complex three-dimensional geometry and being made from a multitude of different materials.

Hard magnetic structures having high aspect ratios and field distributions which are improved accordingly may be manufactured.

One of the surfaces of the substrate serves as a surface of the measuring bar. In the event of an Si substrate, the surface is completely planar. Additionally, the hard magnetic structures are protected against environmental influences and/or corrosion of any kind in a simple manner.

With such an inventive magnetic measuring bar, magnetic position detection exhibiting a particularly high level of resolution may be implemented in devices and installations of any kind.

Exemplary embodiments of the invention provide a method of producing a three-dimensional magnetic measuring bar, wherein for structures having lateral dimensions d of up to 500 µm, aspect ratios L/d>1 may be produced, for structures having lateral dimensions d of up to 50 µm, aspect ratios L/d>10 may be produced, the magnetic flux of the magnetic pole structures 13 may be closed, on their rear sides, with a soft magnetic layer in each case, tapering of the magnetic poles 13 on their front sides may be achieved, e.g., by combining anisotropic etching and deep etching, tapering of the magnetic poles 13 made from a ferromagnetic material having a higher level of saturation magnetization may be produced as compared to a hard magnetic material forming the magnetic poles 13, and magnetic pole structures 13 may be integrated both on planar and three-dimensionally shaped substrates 10 made of most varied materials, provided that the materials used withstand the process of manufacturing the porous molded bodies 13 without being damaged.

FIGS. 1 to 12 have been used for illustrating and graphically describing the inventive method. It shall be understood that FIGS. 1 to 12 also show embodiments of inventive devices claimed in the claims.

Above-described embodiments are independent of a specific size (e.g. diameter or lateral dimension). The magnetic particles 12 may have diameters of, e.g., from 1 μm to 20 μm, from 2 μm to 15 μm, or 5 μm to 12 μm. Other magnetic particles 12 may have diameters or lateral dimensions ranging from 0.1 μm to 20 μm, 0.5 μm to 5 μm, or 0.8 μm to 1.2 μm, for example.

Even though above-described embodiments have been described to the effect that the magnetic porous structure 13 comprises cavities which are at least partly connected to one another, one may also achieve, in particular with a particle size of <2 μm, by means of the coating process, for the porous structure 13 to be sealed, i.e. for the cavities between the particles 12 to be closed.

Even though above-described embodiments have been described to the effect that the substrate 10 has a planar shape, the substrate 10 may also have other shapes. For example, the substrate 10 may have a curved shape (e.g. a dome structure) or a shape in which portions are planar and/or bent.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device.

The method steps described may also be performed in any order other than that indicated in the claims.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

SOURCES

[1] http://www.interpatent.de/fensterbaufirmen_laengen-messung.html

[2] http://www.bogen-electronic.com/Lineare_Massstae-be.html

[3] http://sensitec.com/deutsch/produkte/winkel/winkelmes-sung-erlaeuterung.html

[4] Z.-H. Xu et al., "Grooved multi-pole magnetic gratings for high-resolution positioning systems", Japanese Journal of Applied Physics 54, 2015

[5] C. Zhi et al., "A polydimethylsiloxane diaphragm integrated with a sputtered thin film NdFeB magnet", Microsyst Technol (2015)21:675-681

[6] T. Reimer et al., "Temperature-stable NdFeB micromagnets with high-energy density compatible with CMOS back end of line technology", MRS Advances, February 2016

The invention claimed is:

1. A device comprising:

a substrate comprising at least two mutually spaced-apart cavities, each cavity comprising a depth of at least 50 μm, wherein the cavities are filled up with magnetic particles which enter into contact with one another at points of contact and form cavities between the points of contact, and wherein at least some of the magnetic particles are connected to one another at their points of contact by means of a coating, specifically in such a manner that the cavities are at least partly penetrated by the coating and such that the connected magnetic particles consequently form a magnetic porous structure, wherein the cavities each comprise, at their portion which is lower when viewed in the direction of depth, a tapered portion which is filled with a material comprising a higher level of saturation magnetization as compared to that of the magnetic particles.

2. The device as claimed in claim 1, wherein each cavity comprises an aspect ratio of at least 4:1 or 6:1 or 10:1.

3. The device as claimed in claim 1, wherein each cavity comprises a lateral extension of 250 μm or less, or of 100 μm or less, or of 50 μm or less, or of 25 μm or less.

4. The device as claimed in claim 1, wherein the substrate has a soft magnetic coating applied onto it which extends across the cavities filled with the magnetic particles so as to seal the cavities.

5. The device as claimed in claim 1, wherein the cavities are formed within the substrate such that a residual thickness, which remains in the direction of depth, between the deepest point of the cavity and that outer side of the substrate which is adjacent to said deepest point amounts to from 10 μm to 100 μm.

6. The device as claimed in claim 1, wherein the substrate comprises a base substrate and a covering substrate comprising at least two openings which fully extend through said covering substrate, wherein the openings within the covering substrate comprise a distance which is identical to a distance between at least two cavities within the base substrate, and wherein the covering substrate is joined to the base substrate such that the at least two openings within the covering substrate become congruent with the at least two cavities within the base substrate.

7. A microfabricated magnetic measuring bar comprising:

a substrate comprising at least two mutually spaced-apart cavities, each cavity comprising a depth of at least 50 μm, wherein the cavities are filled up with magnetic particles which enter into contact with one another at points of contact and form cavities between the points of contact, and wherein at least some of the magnetic particles are connected to one another at their points of contact by means of a coating, specifically in such a manner that the cavities are at least partly penetrated by the coating and such that the connected magnetic particles consequently form a magnetic porous structure;

wherein the cavities each comprise, at their portion which is lower when viewed in the direction of depth, a tapered portion which is filled with a material comprising a higher level of saturation magnetization as compared to that of the magnetic particles, and a magnetic sensor configured to determine the magnetic field strength emanating from the device in that it is moved past the porous magnetic structures at a distance from the substrate and along an outer side of the substrate, specifically on that outer side of the substrate which is located opposite the opening of the respective cavity.

* * * * *